(12) United States Patent
Lee et al.

(10) Patent No.: US 10,374,004 B2
(45) Date of Patent: Aug. 6, 2019

(54) INTEGRATED CIRCUIT WITH HALL EFFECT AND ANISOTROPIC MAGNETORESISTIVE (AMR) SENSORS

(71) Applicant: TEXAS INSTRUMENTS INCORPORATED, Dallas, TX (US)

(72) Inventors: Dok Won Lee, Mountain View, CA (US); William David French, San Jose, CA (US); Keith Ryan Green, Prosper, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/257,410

(22) Filed: Jan. 25, 2019

(65) Prior Publication Data

US 2019/0157342 A1 May 23, 2019

Related U.S. Application Data

(62) Division of application No. 15/865,825, filed on Jan. 9, 2018, now Pat. No. 10,211,255, which is a division of application No. 15/070,413, filed on Mar. 15, 2016, now Pat. No. 9,893,119.

(51) Int. Cl.
| | | |
|---|---|---|
| H01L 27/22 | (2006.01) | |
| H01L 43/06 | (2006.01) | |
| H01L 43/14 | (2006.01) | |
| H01L 43/04 | (2006.01) | |

(52) U.S. Cl.
CPC .............. *H01L 27/22* (2013.01); *H01L 43/04* (2013.01); *H01L 43/065* (2013.01); *H01L 43/14* (2013.01)

(58) Field of Classification Search
CPC ........ H01L 27/22; H01L 43/04; H01L 43/065
See application file for complete search history.

(56) References Cited

U.S. PATENT DOCUMENTS

| | | | |
|---|---|---|---|
| 8,836,327 B2 | 9/2014 | French et al. | |
| 2006/0255797 A1* | 11/2006 | Taylor | G01R 15/207 324/262 |
| 2007/0200564 A1 | 8/2007 | Motz et al. | |
| 2012/0299587 A1* | 11/2012 | Rieger | G01R 33/0206 324/247 |
| 2013/0168808 A1 | 7/2013 | Papou et al. | |
| 2014/0354276 A1 | 12/2014 | Trochut et al. | |
| 2015/0276892 A1 | 10/2015 | Butenhoff et al. | |
| 2015/0311355 A1 | 10/2015 | Hopper et al. | |
| 2015/0338474 A1 | 11/2015 | Mohan et al. | |

OTHER PUBLICATIONS

Honeywell Sensor Products, AN211, Application Note, "Applications of Magnetic Position Sensors", Solid State Electronics Center, www.magneticsensors.com, Jan. 2002 Rev., 8 pgs.
Sensitec AA700, "Magnetorestive Sensors for Angular and Linear Position Sensing Applications", Sensitec GMBH, Germany, www.sensitec.com, Oct. 2009, 4 pgs.

* cited by examiner

*Primary Examiner* — Errol V Fernandes
(74) *Attorney, Agent, or Firm* — Andrew R. Ralston; Charles A. Brill; Frank D. Cimino

(57) ABSTRACT

Disclosed examples provide wafer-level integration of magnetoresistive sensors and Hall-effect sensors in a single integrated circuit, in which one or more vertical and/or horizontal Hall sensors are formed on or in a substrate along with transistors and other circuitry, and a magnetoresistive sensor circuit is formed in the IC metallization structure.

15 Claims, 30 Drawing Sheets

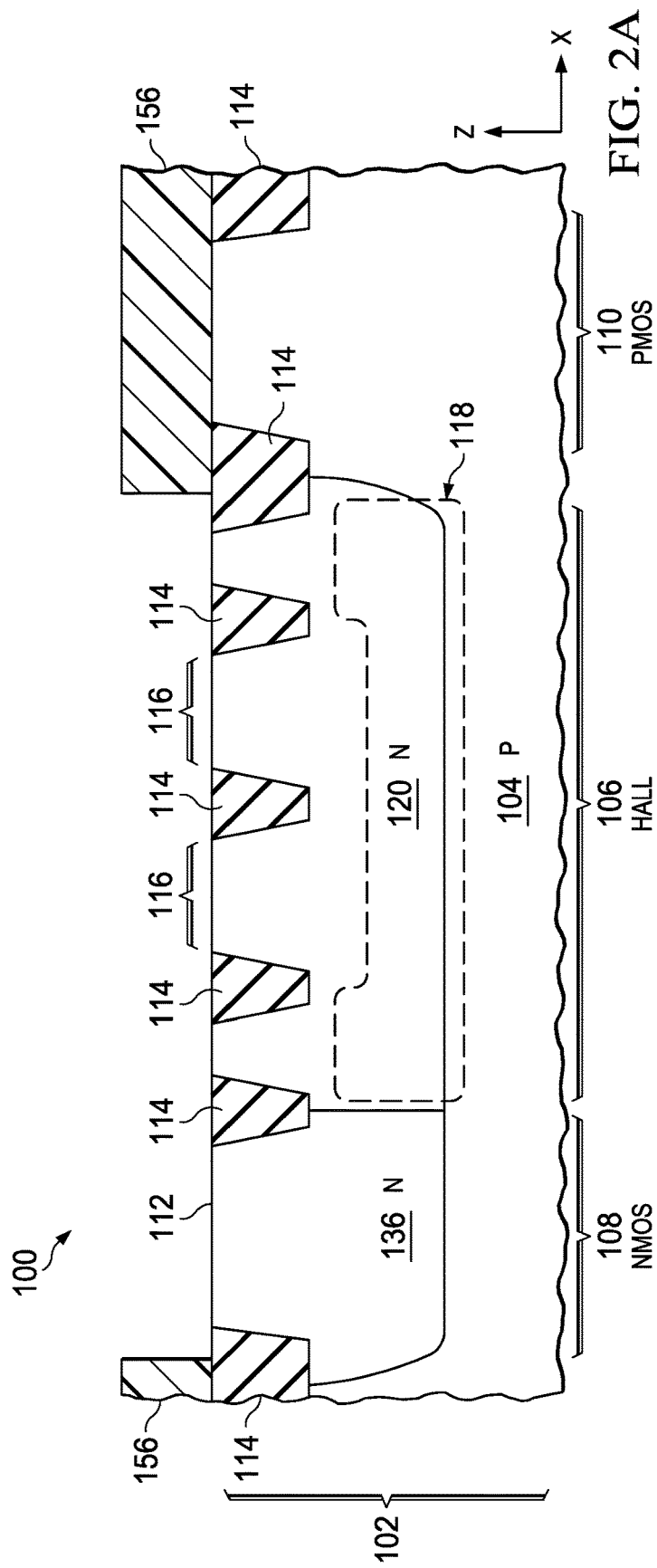

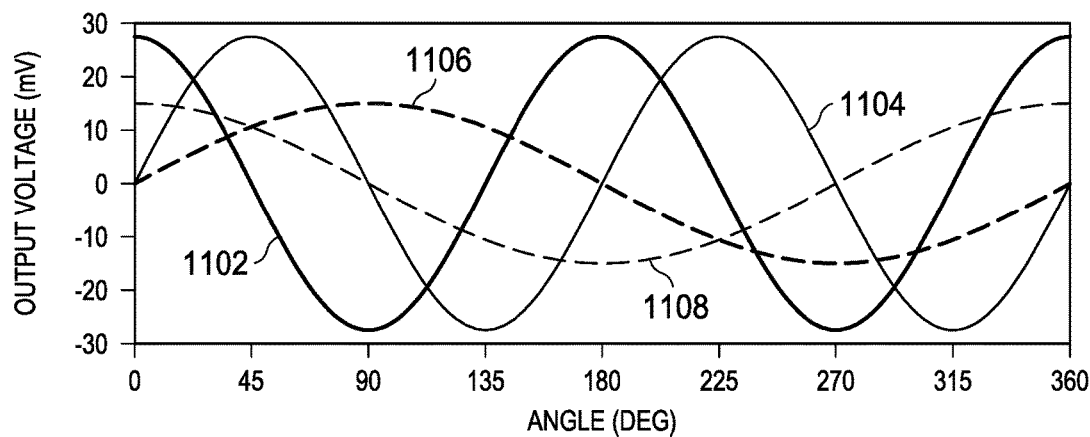
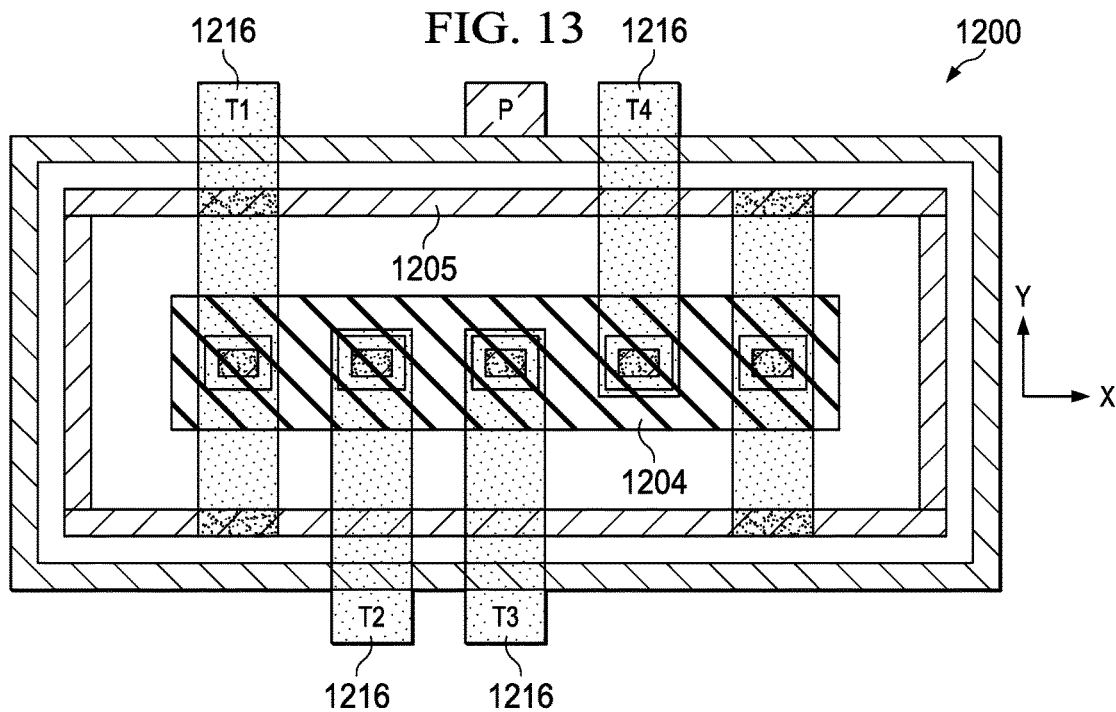

INTEGRATED CIRCUIT WITH HALL EFFECT AND ANISOTROPIC MAGNETORESISTIVE (AMR) SENSORS

CROSS REFERENCE TO RELATED APPLICATIONS

This application is a divisional of U.S. patent application Ser. No. 15/865,825, filed Jan. 9, 2017 and issued as U.S. Pat. No. 10,211,255, which is a divisional of U.S. patent application Ser. No. 15/070,413, filed Mar. 15, 2016 and issued as U.S. Pat. No. 9,893,119, the contents of each application being incorporated herein by reference in its entirety. The following U.S. applications are referenced: U.S. patent application Ser. No. 14/932,949, entitled CONSTRUCTION OF A HALL-EFFECT SENSOR IN AN ISOLATION REGION, filed Nov. 4, 2015 and issued as U.S. Pat. No. 9,728,581; and U.S. patent application Ser. No. 15/041,575, entitled INTEGRATED ANISOTROPIC MAGNETORESISTIVE DEVICE, filed Feb. 11, 2016 and issued as U.S. Pat. No. 10,276,787, all of which the contents are herein incorporated by reference in their entireties.

TECHNICAL FIELD

The present disclosure relates generally to integrated circuits (ICs) and more particularly to ICs with integrated Hall effect and magnetoresistive sensors and methods for making the same.

BACKGROUND

Rotation and position sensing technology has evolved from contact sensing to contactless sensing and from discrete sensors to integrated sensors. Hall effect sensors are one form of sensor that provides detection of magnetic fields which can be used in rotation and position sensing applications. Fluxgate and magnetoresistive (MR) sensors provide improved sensitivity relative to Hall-effect sensors. In many applications, it is desirable to provide 360° sensing capability. However, magnetoresistive sensors are limited to 180° rotation detection. Multiple discrete Hall effect or magnetoresistive sensors can be positioned on a printed circuit board in angularly spaced relationship to one another in order to provide 360° sensing, but this increases system size, complexity and cost.

SUMMARY

Disclosed examples include integrated circuits with magnetoresistive sensors and Hall-effect sensors, as well as fabrication techniques for manufacturing such, in which one or more vertical and/or horizontal Hall sensors are formed on or in a substrate along with transistors and other circuitry, and a magnetoresistive sensor is formed in a metallization structure. The disclosed wafer-scale integration of Hall and magnetoresistive sensor technology along with P and N-channel transistors in a single integrated circuit can facilitate compact and cost-effective high precision 360° detection for rotation and position sensing applications.

BRIEF DESCRIPTION OF THE DRAWINGS

FIGS. 2A-2E are partial sectional side elevation views of the IC of FIG. 1 at intermediate stages of fabrication to form transistors and a Hall effect sensor circuitry including a horizontal Hall effect sensor with a Hall plate in a substrate.

FIG. 11 is a graph illustrating sensor voltage signals from the AMR and Hall sensors in the IC of FIG. 10.

FIGS. 12 and 13 are partial sectional side elevation and top plan views of an example 5 contact vertical Hall sensor structure formed on or in an epitaxial silicon substrate in an IC with one or more magnetoresistive sensors, including a Hall plate formed in a deep well.

DETAILED DESCRIPTION

Figure 1:
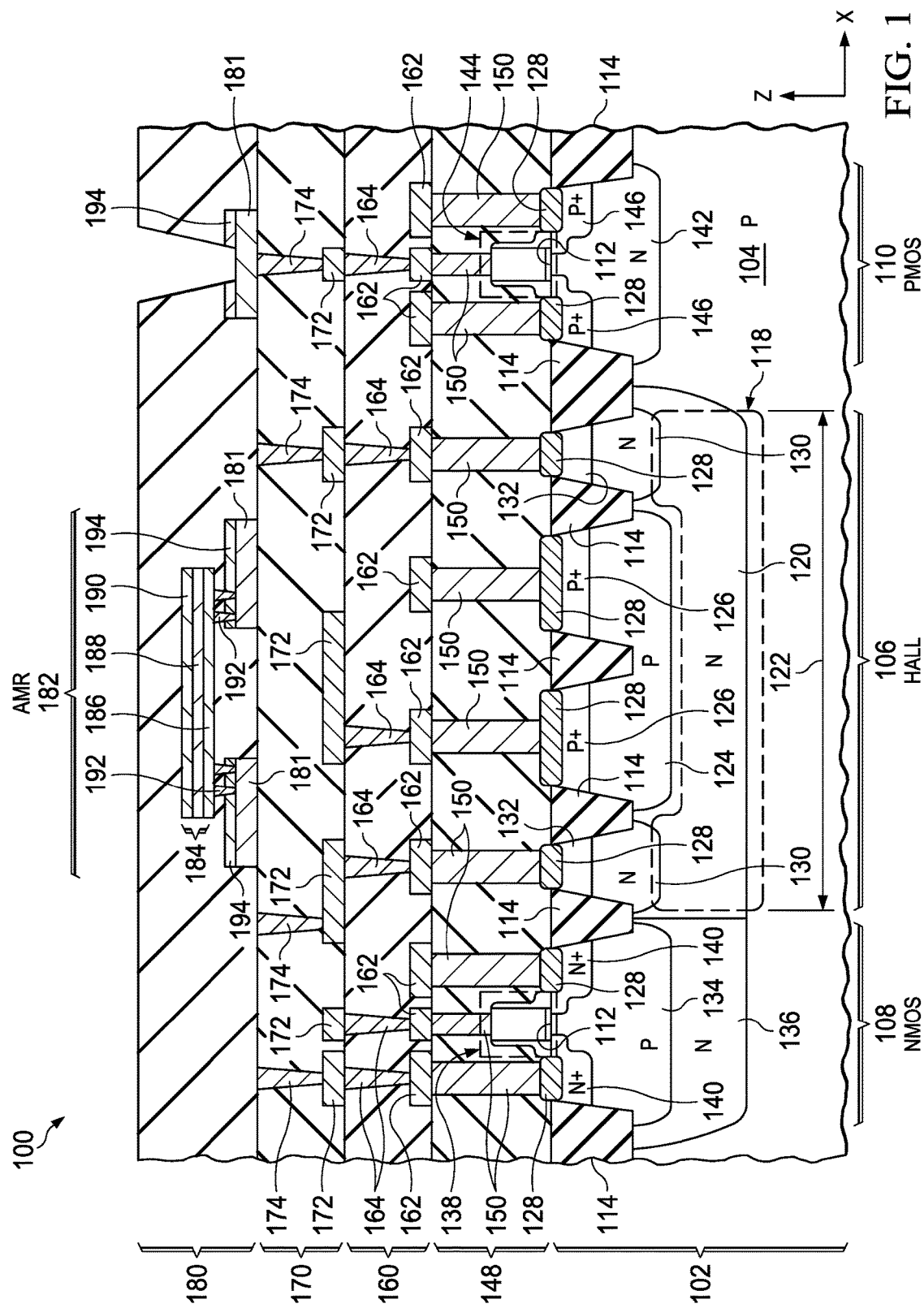
FIG. 1 is a partial sectional side elevation view of an example integrated circuit with a Hall effect sensor circuit and a magnetoresistive sensor circuit.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical connection or combinations thereof. For example, if a first device couples to or is coupled with a second device, that connection may be through a direct electrical connection, or through an indirect electrical connection via one or more intervening devices and connections.

Disclosed examples demonstrate wafer-level integration of magnetoresistive (MR) sensors and Hall-effect sensors in a single IC. One or more vertical and/or horizontal Hall sensors are formed on or in a substrate along with transistors and other circuitry such as current sources and voltage readouts to interface with the sensors, and a magnetoresistive sensor circuit is formed in the IC metallization structure. In certain disclosed examples, anisotropic magnetoresistive (AMR) sensors are used. In other examples, different types of magnetoresistive sensors are provided, such as giant magnetoresistive (GMR) sensors, tunneling magnetoresistive (TMR) sensors, etc. Although examples are described below with respect to integrated AMR sensors, the described concepts are applicable to other forms of magnetoresistive sensor circuits and structures. Disclosed examples provide fully integrated wafer-level sensor configurations to facilitate high-precision 360° rotation and certain examples also provide 3-D position sensing using a single integrated circuit for compact, low cost solutions in a variety of end-use applications. In certain embodiments, AMR sensors provide high-precision rotation sensing, and the addition of one or more vertical or horizontal vertical Hall sensors provides polarity detection to facilitate 360° rotation sensing.

In certain examples, one or more Hall effect sensors are fabricated during front-end IC fabrication processing to form a Hall plate along with P and N-channel transistors on or in a semiconductor substrate, and AMR or other magnetoresistive sensors are fabricated during the back-end processing to form the metallization structures for the IC. The interconnection of various circuit components in the metallization structure provides for connection of magnetoresistive segment structures into bridge circuits and connection of the segment structures with supply voltages and voltage readouts to construct magnetoresistive sensor circuitry along with one or more Hall-effect sensor circuits in a single package. In certain implementations, two Wheatstone bridge circuits are formed by AMR sensor segments, and segments of the two bridge circuits are angularly offset from one another by 45° to provide high resolution 180° rotation sensing capability. The combination with a vertical or horizontal Hall sensor in the same IC allows the circuit to provide sensor output signaling that represents the actual rotation through 360° and/or 3-D position sensing where both vertical and horizontal Hall sensors are combined with one or more AMR sensors. The disclosed integrated circuit examples can be used in a variety of applications, including steering, clutch actuation, exhaust gas recirculation, vehicle pedal position sensing, transmission oil pump position sensing, throttle position sensing, electronic stability control, chassis height detection, and other vehicle based applications, as well as for tilt angle detection in portable phones or other user devices, machine control applications, etc. In these and other applications, the disclosed solutions provide compact sensing devices in a single integrated circuit without the mechanical complexity and cost associated with conventional mounting of multiple discrete sensors on a printed circuit board (PCB).

Full integration on a silicon wafer or other substrate provides a smaller form factor, both laterally and vertically, compared with mounting multiple discrete sensors on a circuit board, and the disclosed solutions facilitate significantly reduced manufacturing cost. Also, fabrication of Hall and magnetoresistive sensors as part of a single integrated circuit fabrication process provides more accurate control of the relative sensor arrangement and hence minimizes the error due to the sensor arrangement or placement.

Certain non-limiting example embodiments provide wafer-level integration of anisotropic magnetoresistive sensors and a vertical Hall effect sensor for linear position sensing. Other examples provide wafer-level integration of anisotropic magnetoresistive sensors, a vertical Hall effect sensor and a horizontal Hall sensor for 3D position sensing. Further illustrated embodiments provide wafer-level integration of anisotropic magnetoresistive sensors and horizontal Hall effect sensors for electronic compass and other applications. Moreover, the present disclosure provides fabrication techniques to facilitate formation of integrated circuit transistors, Hall elements and anisotropic magnetoresistive elements in the same process flow.

Figure 2B:
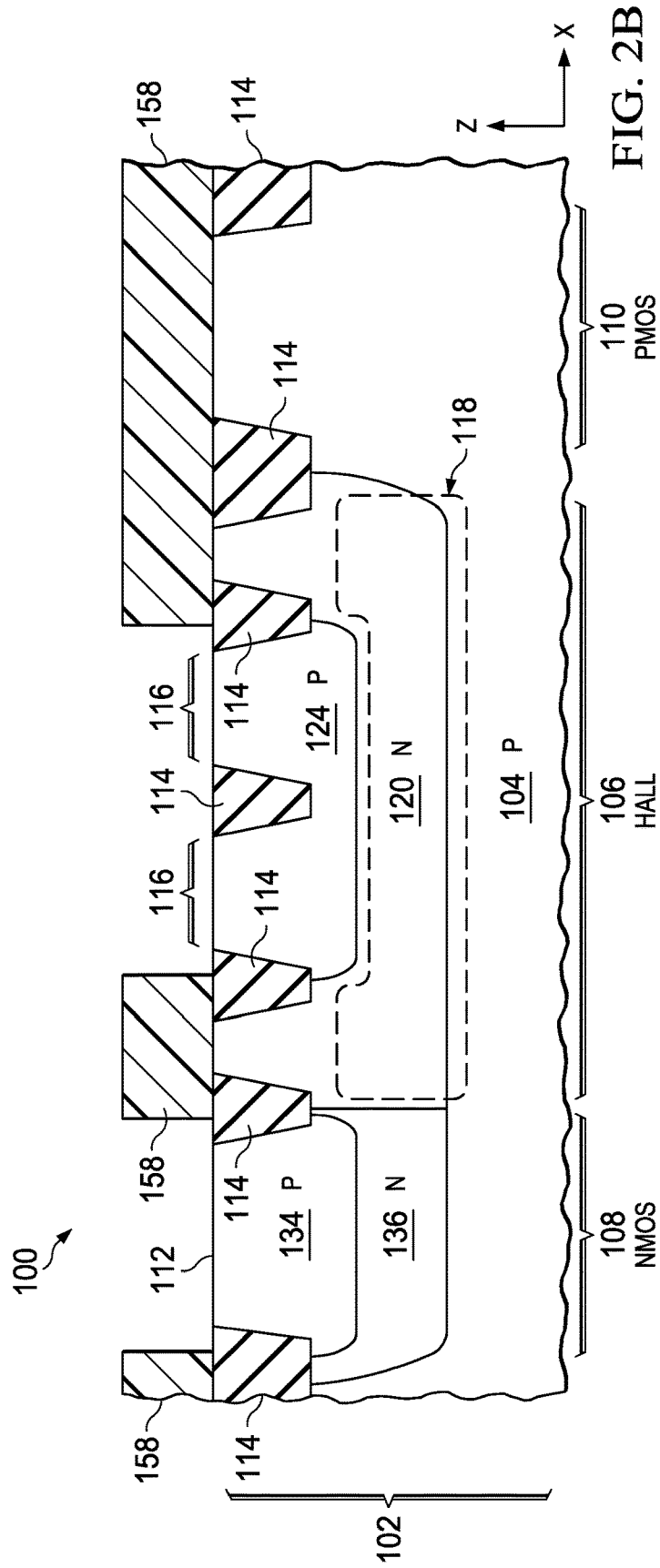
Figure 2C:
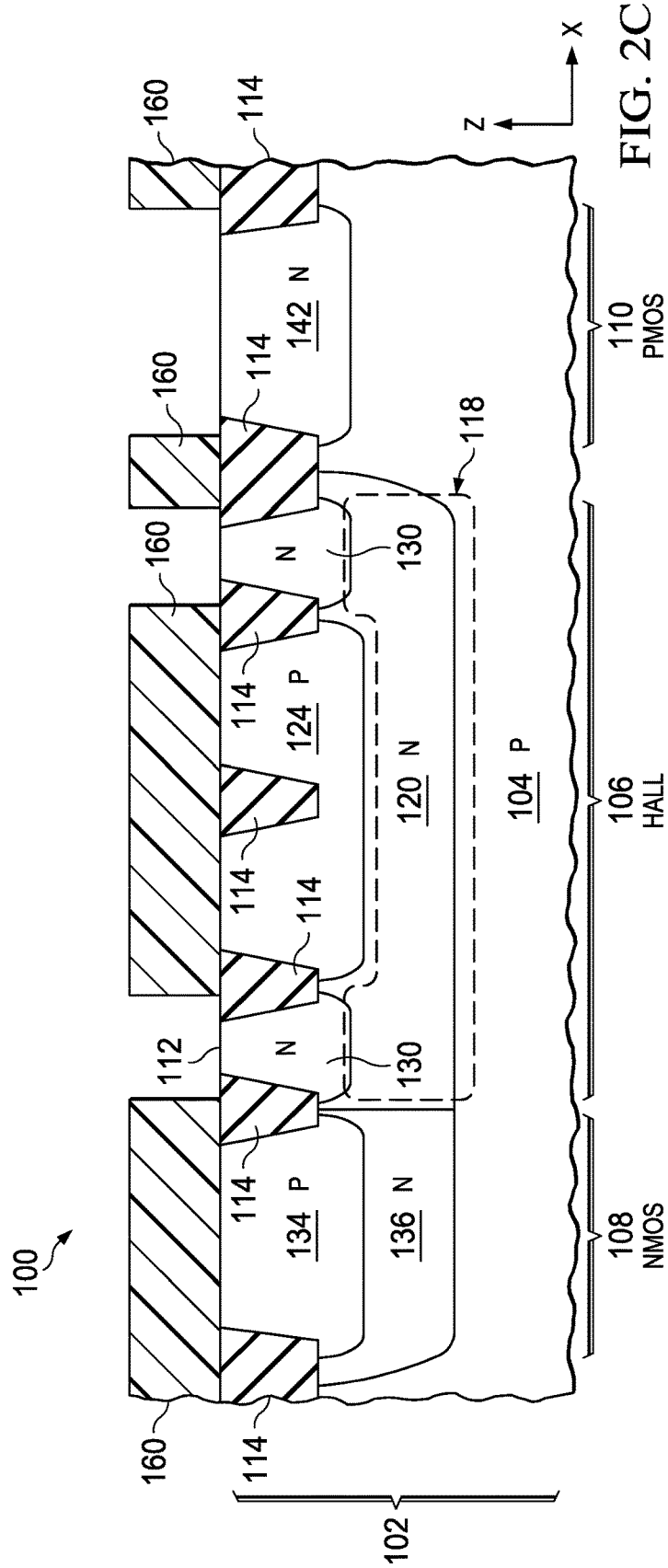
Figure 2D:
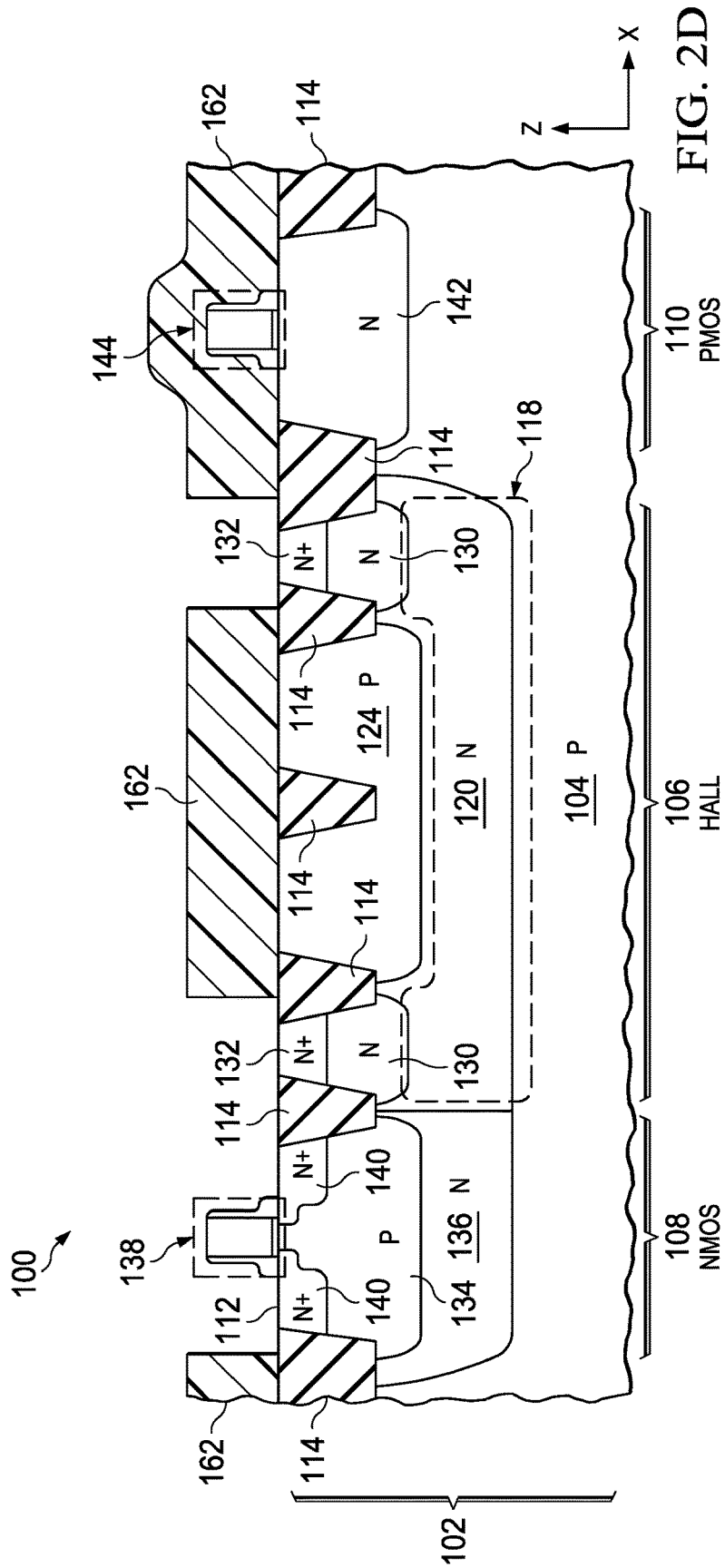
Figure 2E:
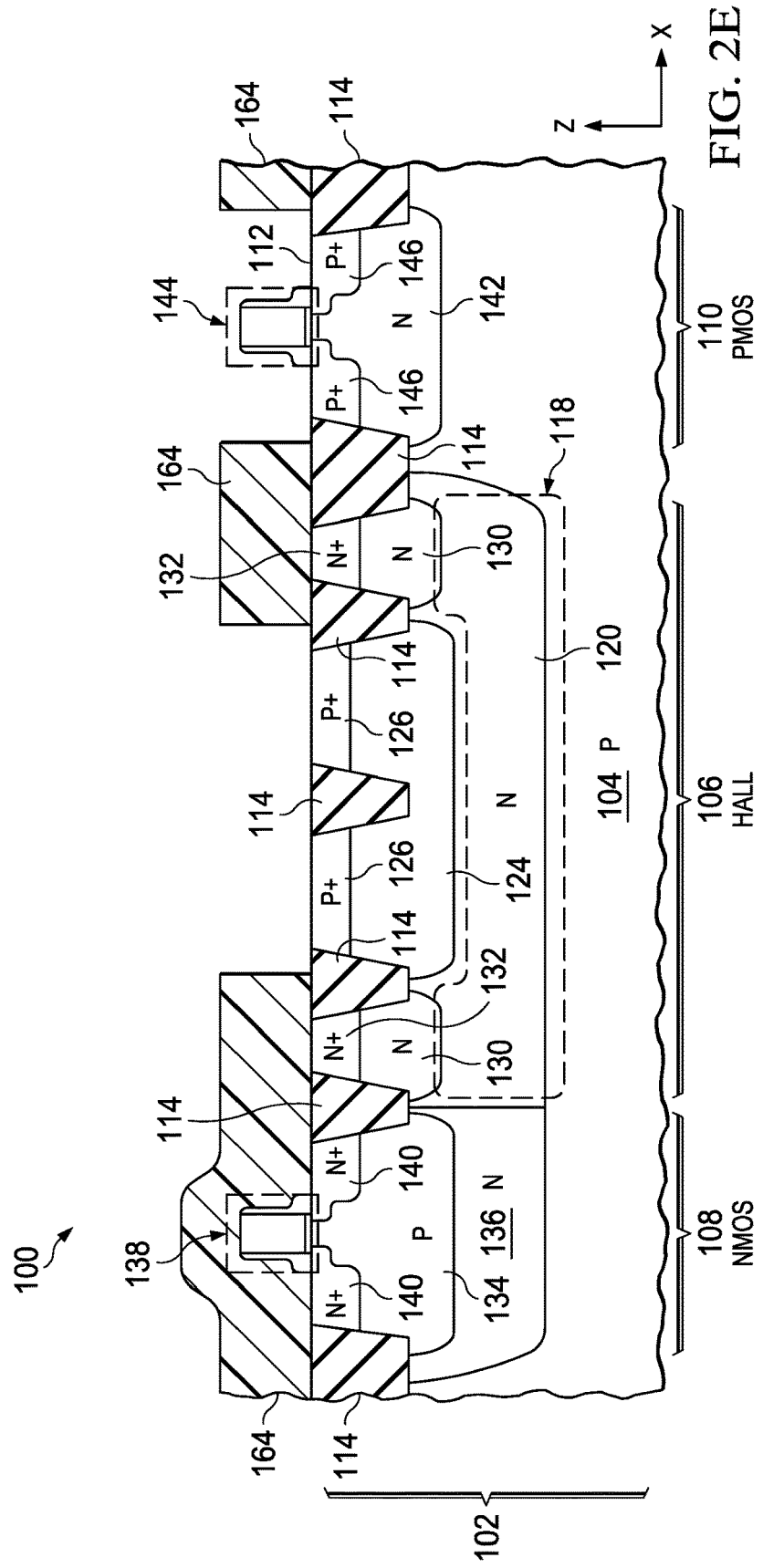
Figure 2F:
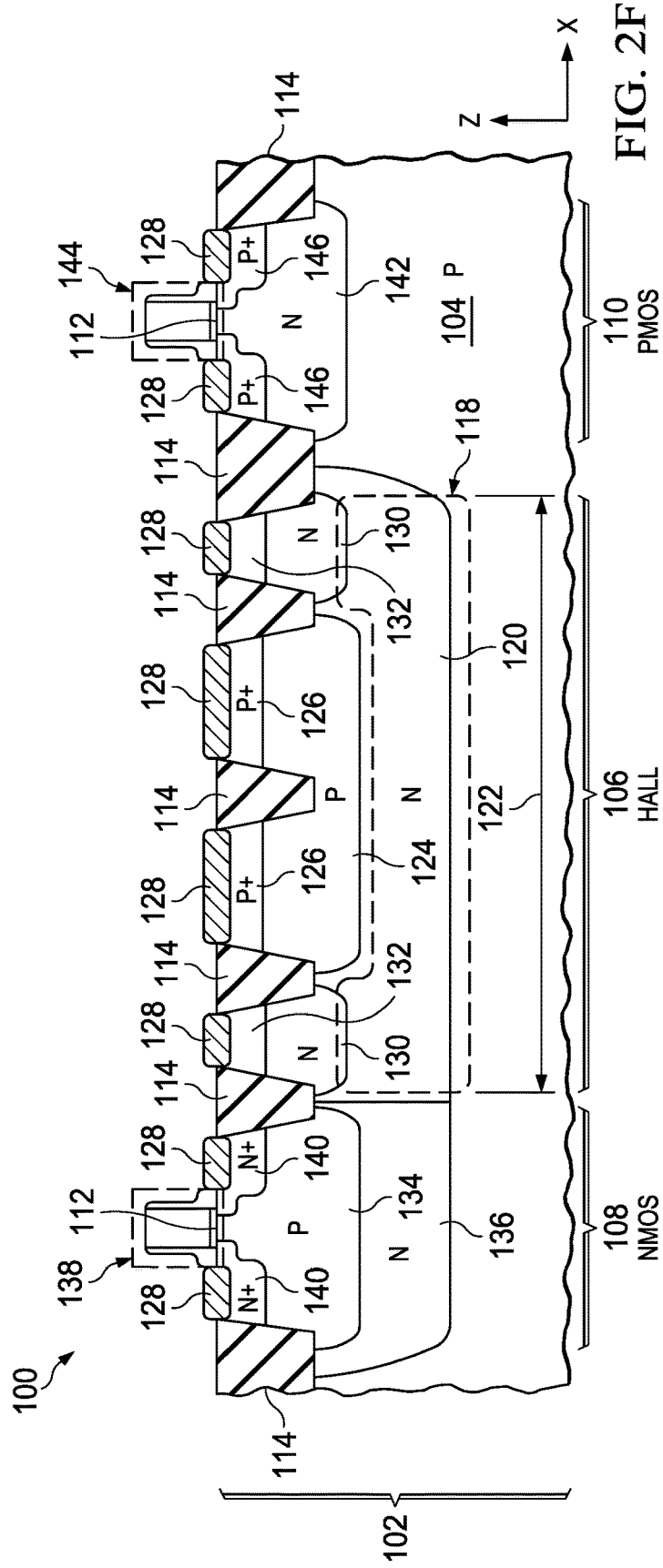
FIGS. 2F-2L are partial sectional side elevation views of the IC of FIG. 1 undergoing further fabrication processing to form metallization structure including an AMR sensor formed in an upper metallization layer.
Figure 2G:
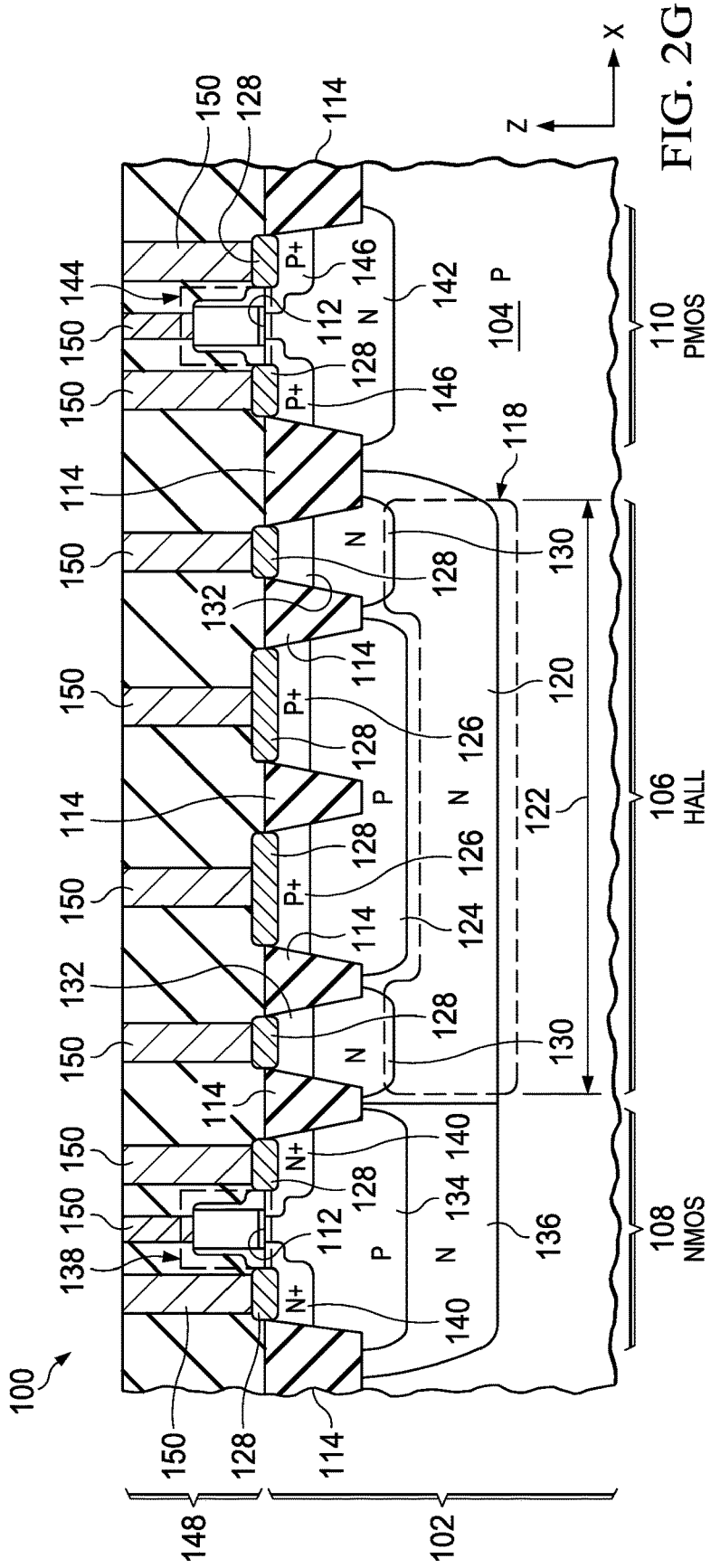
Figure 2H:
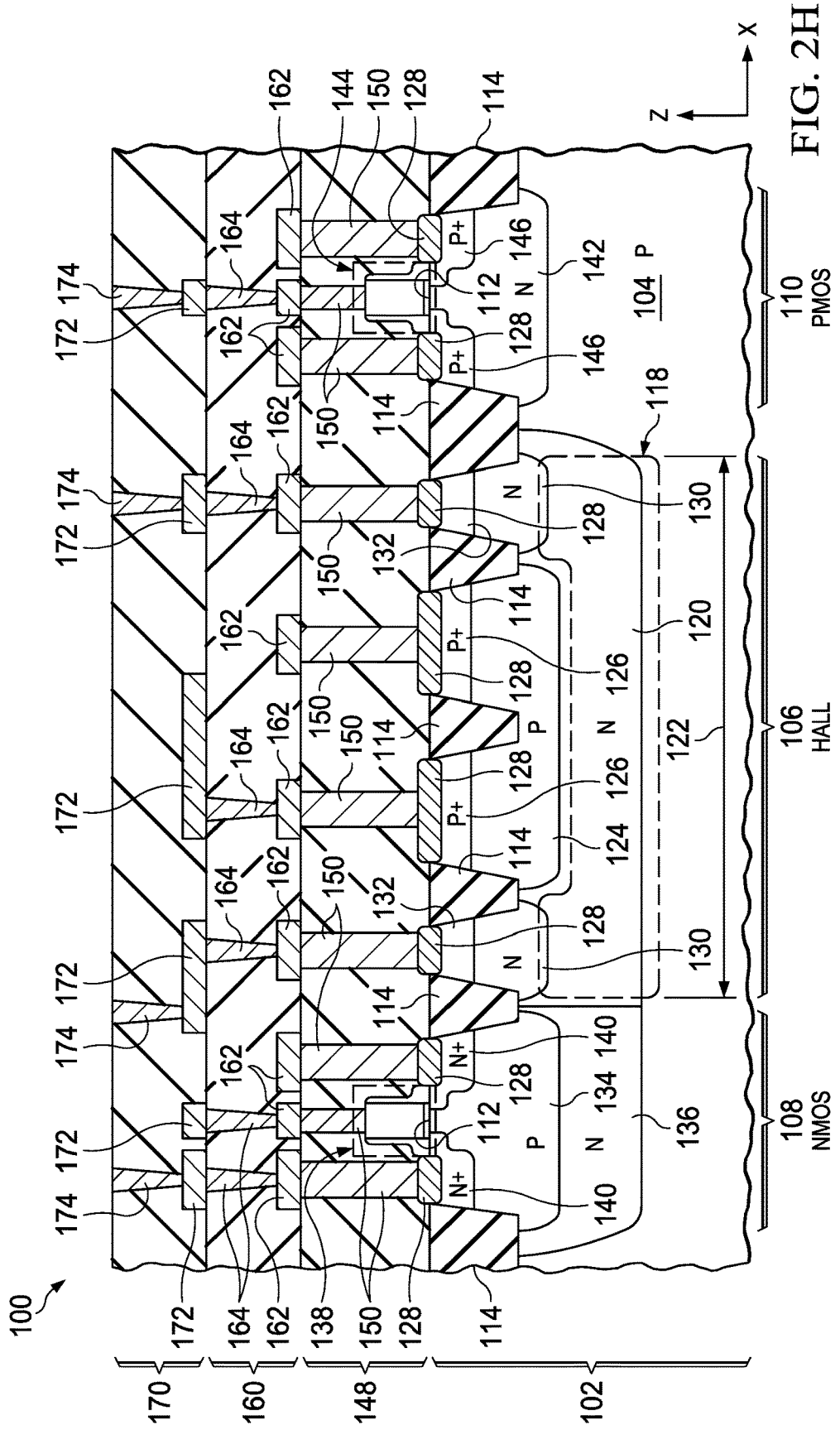
Figure 2I:
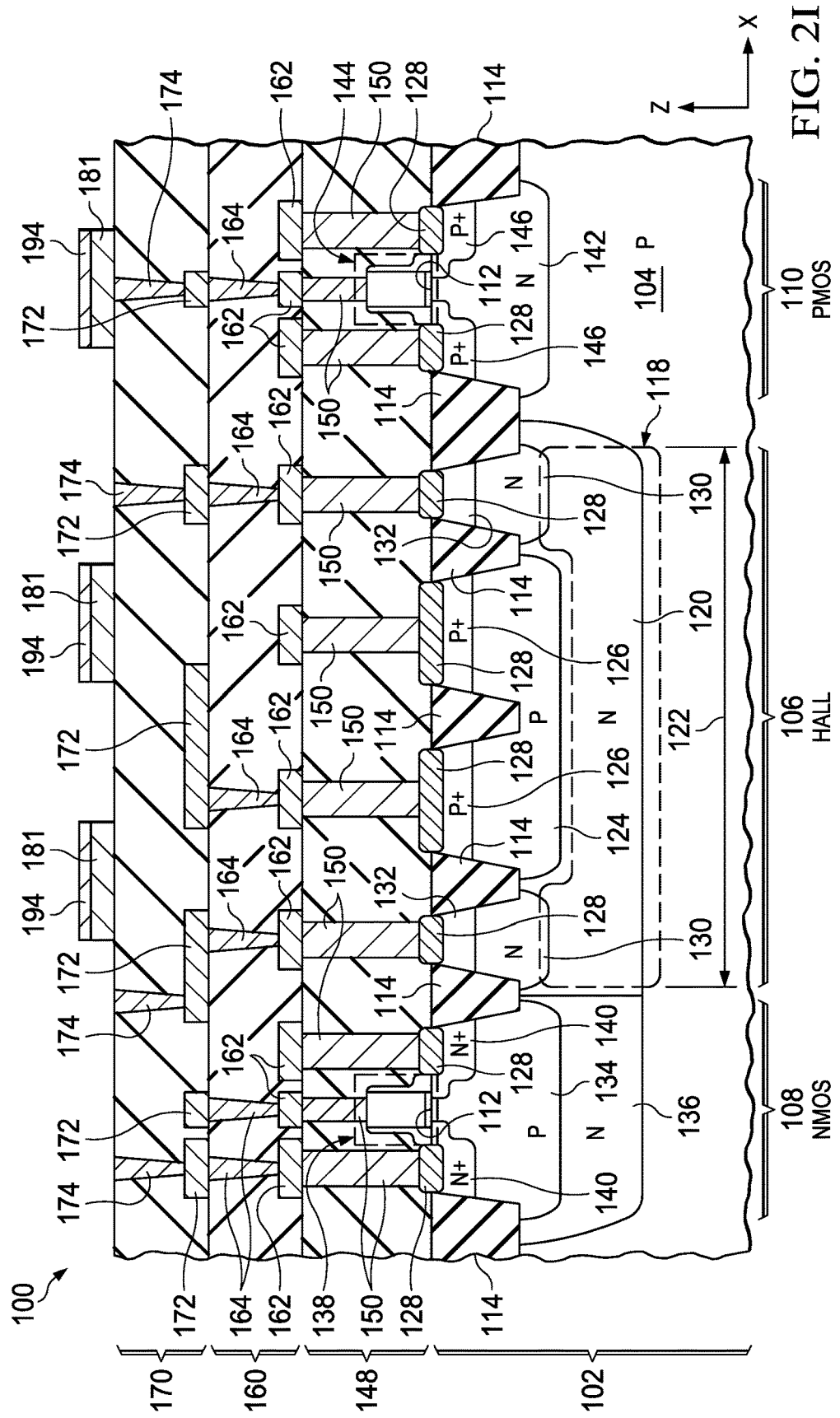
Figure 2J:
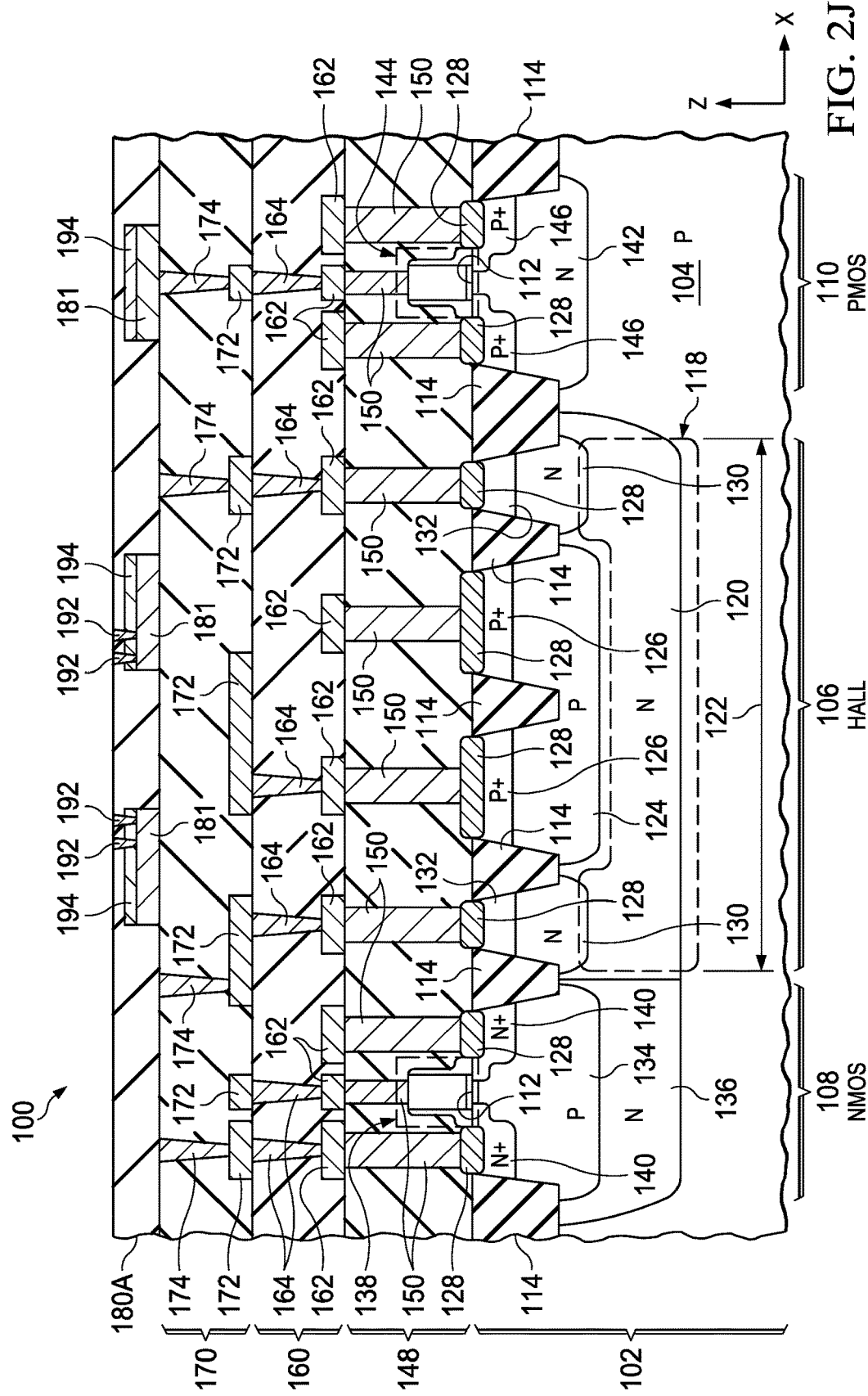
Figure 2K:
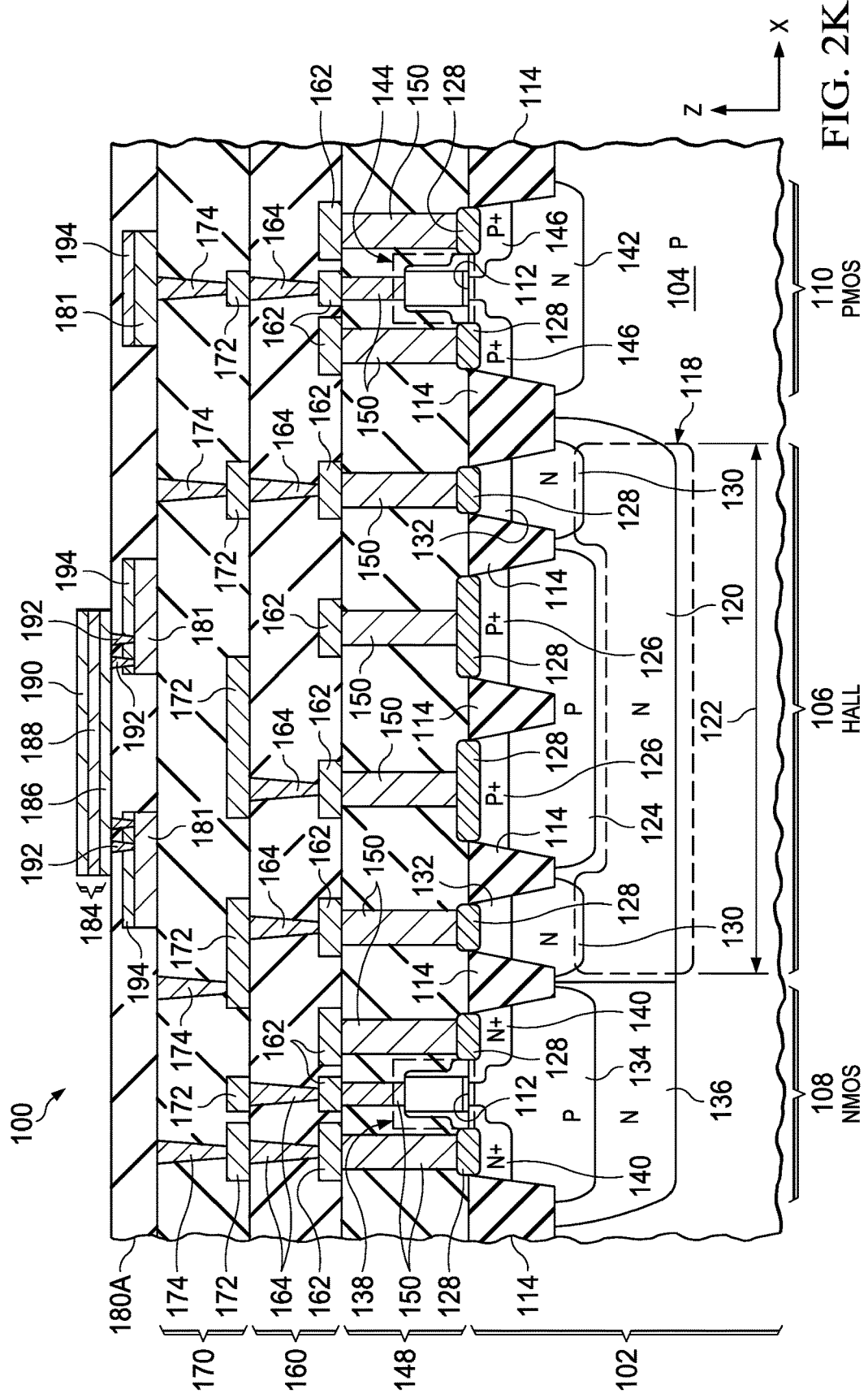
Figure 2L:
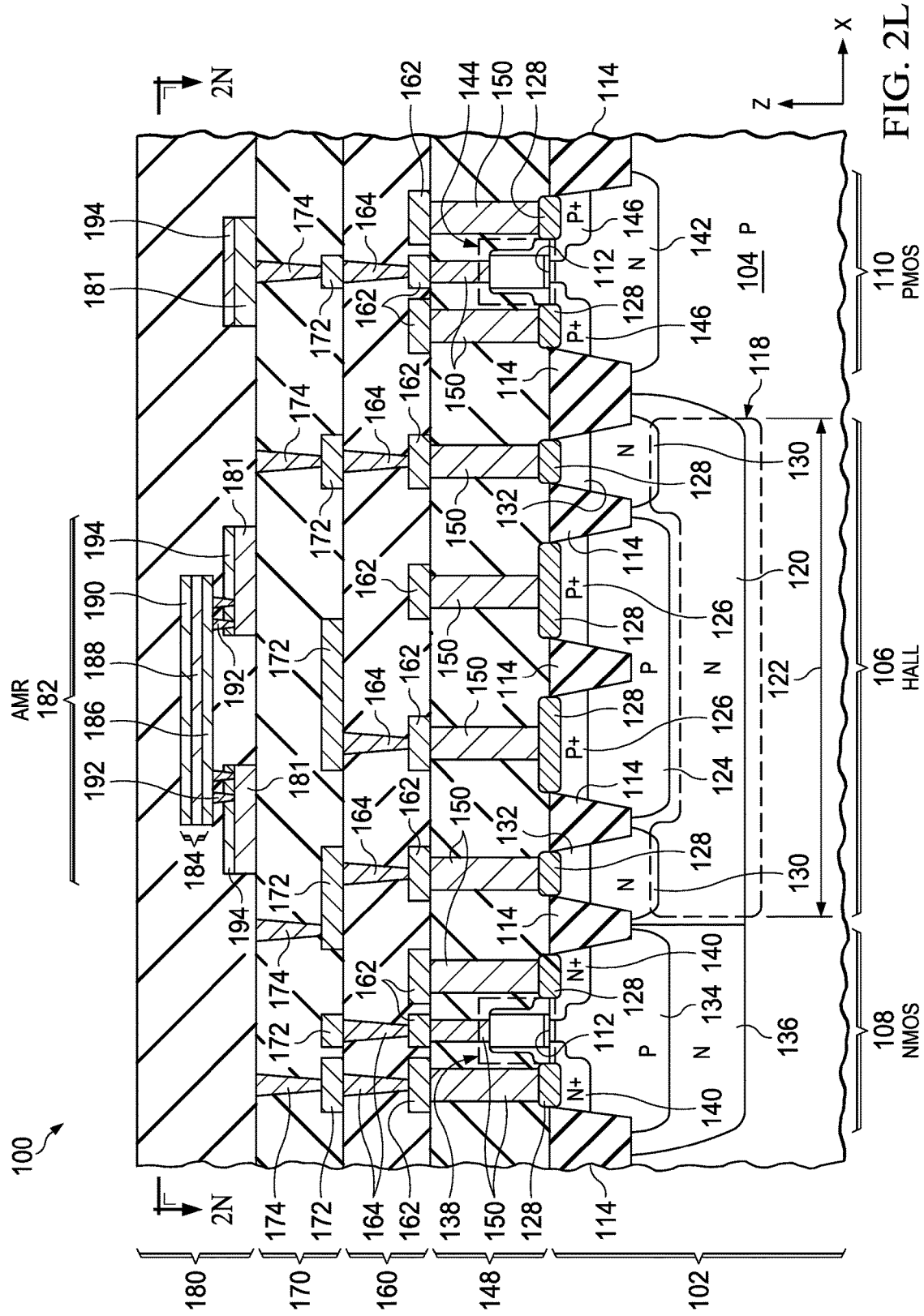
Figure 2M:
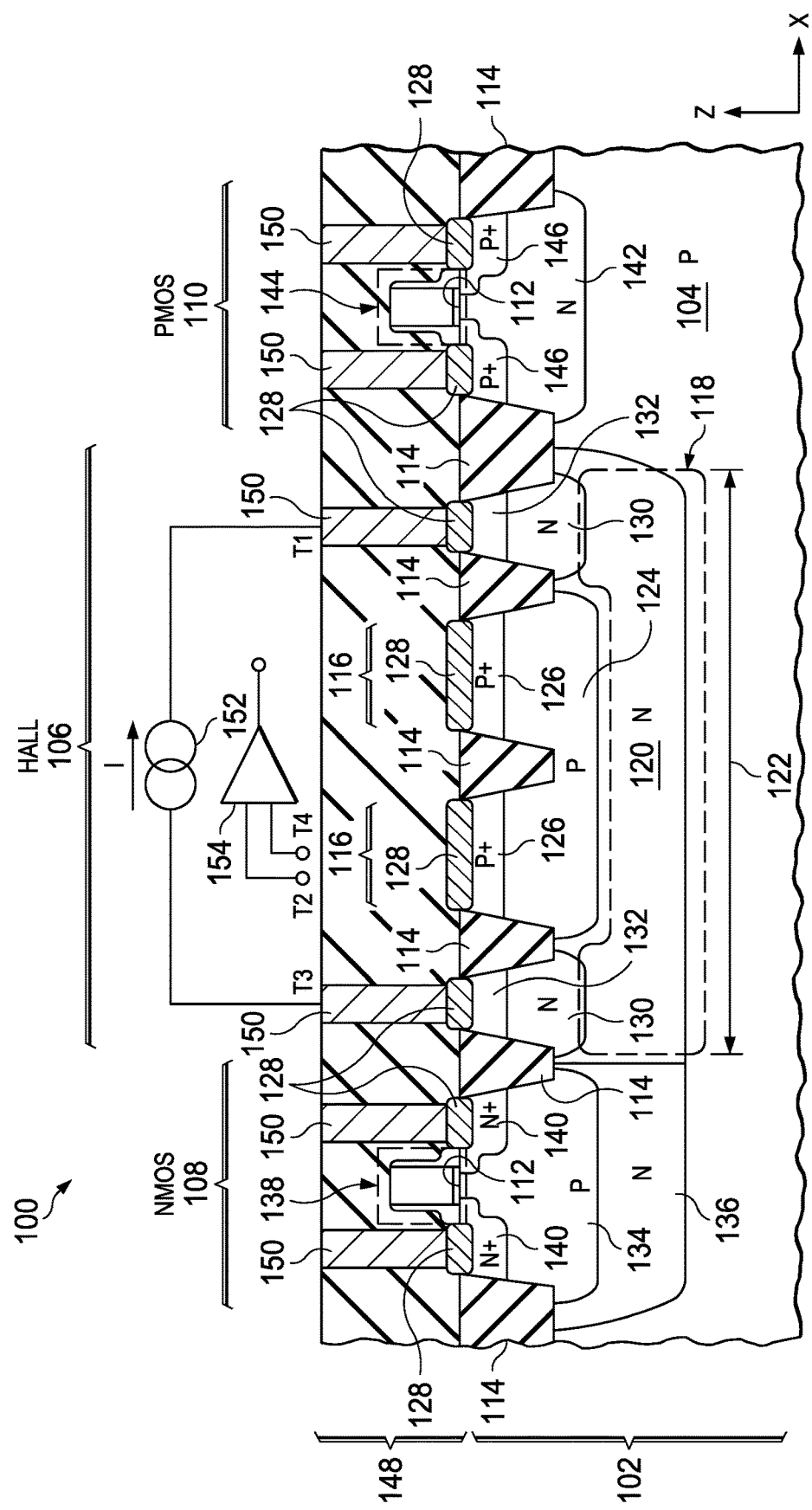
FIG. 2M is a partial sectional side elevation view of the IC of FIG. 1 schematically illustrating a current source and a voltage sensor or voltage readout to interface with the horizontal Hall sensor.
Figure 2N:
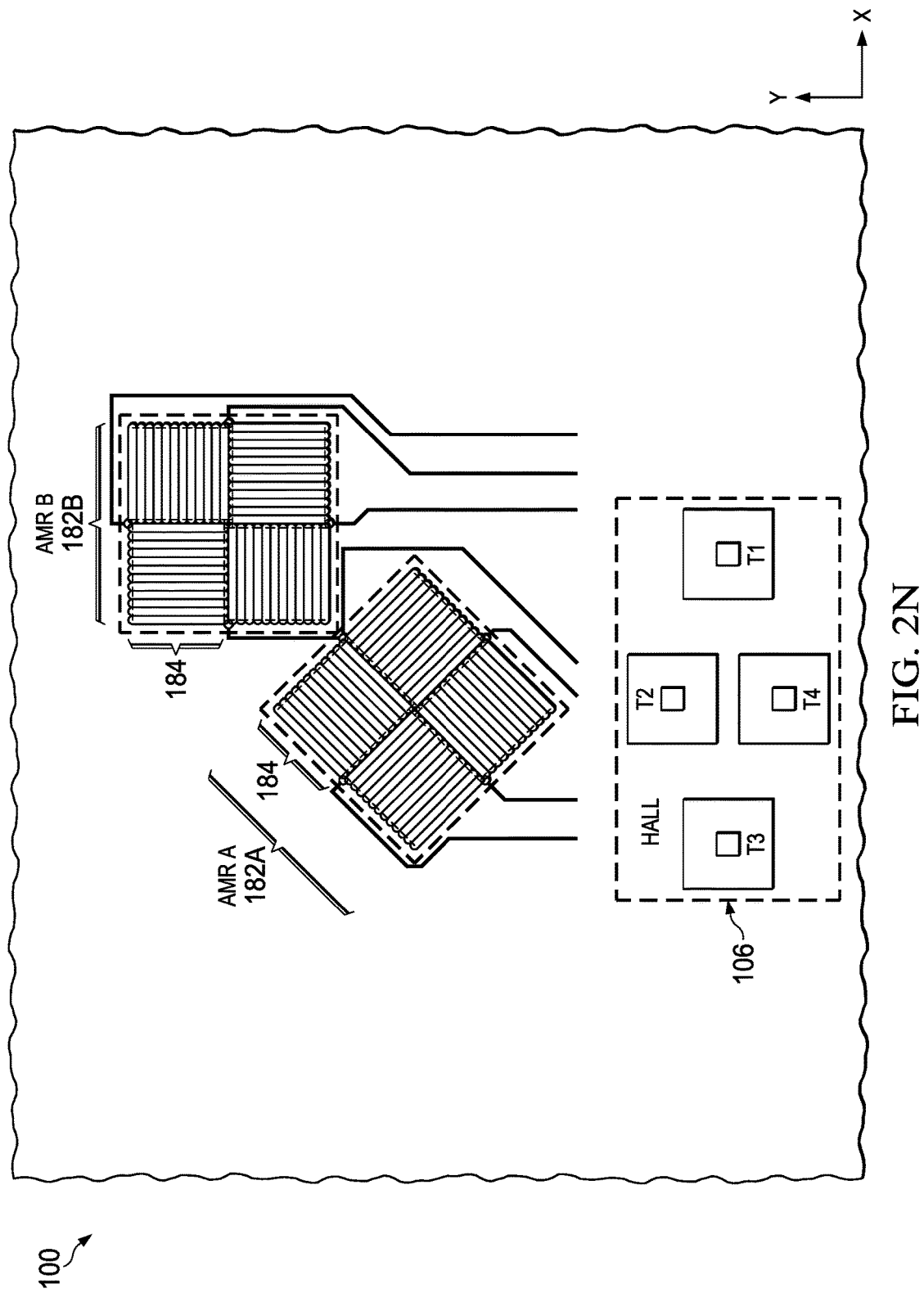
FIG. 2N is a partial top plan view of the IC of FIG. 1.

Referring initially to FIGS. 1 and 2A-2N, FIG. 1 shows a first example integrated circuit (IC) 100 constructed using a silicon wafer or substrate 102, and includes one or more N-channel (e.g., NMOS) transistors 108, P-channel (e.g., PMOS) transistors 110, a lateral or horizontal Hall sensor circuit 106 and one or more anisotropic magnetoresistive (AMR) sensors 182. In one example, the sensor architecture is fabricated directly on and/or in a silicon wafer substrate 102 as shown in FIGS. 2A-2N. Other substrates can be used in different examples, such as other semiconductor wafers, silicon-on-insulator (SOI) substrates or the like. The substrate 102 includes a generally planar top surface 112 extending along an indicated lateral "X" direction in the drawings, and the Hall sensor circuit 106 is formed at least partially on or in the substrate 102. In particular, the Hall sensor circuit 106 includes a Hall plate structure 118 formed as an N-doped region of the substrate 102. In the illustrated example, moreover, the Hall plate structure 118 is disposed at least partially beneath the AMR sensor 182 along a vertical or "Z" direction in the drawings. In this manner, the combined sensing capabilities of the AMR sensor or sensors 182 at the capital Hall effect sensor or sensors 106 are tightly integrated to facilitate position and/or rotation sensing by detecting magnetic fields to which the integrated circuit 100 is exposed. In addition to the sensors 106, 182, the IC 100 also includes one or more n channel transistors 108 and p channel transistors 110 formed at least partially on or in the substrate 102 as seen in FIG. 1. The IC 100 includes a metallization structure, in one example including a pre-metal dielectric (PMD) layer 148, as well as one or more overlying inter-layer dielectric (ILD) metallization layers 160, 170 and 180 disposed over the substrate top surface 112, where the AMR sensor circuit 182 is formed in the metallization structure to sense magnetic fields oriented parallel to the top surface 112 of the substrate 102.

In the example of FIGS. 1-2N, the IC 100 includes a horizontal Hall sensor 106 to sense magnetic fields oriented perpendicular to the top surface 112 of the substrate 102. In this implementation, moreover, first and second AMR sensors 182 are provided in the uppermost metallization layer 182 sense magnetic fields parallel to the top surface 112 of the substrate 102, and the AMR sensors 182 are offset from one another by 45° (e.g., FIG. 2N below). In combination, the AMR sensors 182 and the horizontal Hall sensor 106 facilitate 360° rotation sensing in a single IC 100. As described further in connection with FIG. 3A below, another non-limiting example includes a pair of 45° offset AMR sensors 182 in combination with a vertical Hall sensor 306 to again provide 360° rotational sensing in a single IC 300.

FIGS. 2A-2E illustrate fabrication processing to form the transistors 108, 110 and the horizontal Hall sensor 106 in the IC 100 of FIG. 1. The fabrication in one example uses a silicon substrate 102 (e.g., a silicon wafer) including a p-type semiconductor material 104 which may be a top portion of a silicon wafer, or may be an epitaxial layer formed on a silicon wafer 102. The IC 100 may include field oxide 114 disposed at the top surface 112 of the substrate 102 to laterally isolate components and elements. The field oxide 114 may have a shallow trench isolation (STI) structure as depicted in FIG. 1. Alternatively, the field oxide 114 may have a localized oxidation of silicon (LOCOS) structure. Field oxide with another structure is within the scope of the instant example.

The Hall sensor 106 includes a Hall plate 118 disposed in a first n-type isolation layer 120 in the substrate 102. An average net dopant density of the Hall plate 118, that is an average of a difference between n-type dopants and p-type dopants in the Hall plate 118, may be, for example, $4 \times 10^{16}$ cm$^{-3}$ to $1 \times 10^{17}$ cm$^{-3}$. A vertical thickness of the Hall plate 118 may be 0.5 microns to 1 micron. The average net dopant density and the thickness may provide a sheet resistance of 850 ohms per square to 2500 ohms per square of the Hall plate 118. A lateral length 122 of the Hall plate 118 may be, for example, 25 microns to 125 microns. Increasing the lateral length 122 may provide a higher Hall voltage from the Hall plate 118 which advantageously improves a sensitivity of the Hall sensor 106. Decreasing the lateral length 122 reduces a size of the IC 100 which advantageously reduces fabrication cost. Forming the Hall plate 118 with the lateral length 122 of 25 microns to 125 microns may provide a desired balance between sensitivity and cost. The Hall sensor 106 includes a first shallow p-type well 124 disposed in the substrate 102 over, and extending to, the Hall plate 118. The first shallow p-type well 124 may extend below the field oxide 114. Various structures may be disposed in and/or over the first shallow p-type well 124 over the Hall plate 118. In the instant example, dummy active areas 116 with p-type regions 126, separated by elements of the field oxide 114, may be formed in the first shallow p-type well 124 over the Hall plate 118 to reduce non-planarity of the top surface 112 by an oxide chemical mechanical polish (CMP) process during formation of the field oxide 114. Electrical connections to the Hall plate 118 may be provided by first shallow n-type wells 130 disposed in the substrate 102. FIG. 2M below depicts two example connections to the Hall plate 118; additional connections may be out of the plane of FIG. 2M. The first shallow n-type wells 130 may be laterally separated from the first shallow p-type well 124 by elements of the field oxide 114. N-type contact regions 132 may be disposed in the substrate 102 over the first shallow n-type wells 130 to reduce electrical resistance to the Hall plate 118. Elements of metal silicide 128 may be disposed over the n-type contact regions 132 to further reduce electrical resistance to the Hall plate 118.

The NMOS transistor 108 is disposed over a second shallow p-type well 134 disposed in the substrate 102. The first shallow p-type well 124 of the Hall sensor 106 and the second shallow p-type well 134 have substantially equal distributions of p-type dopants such as boron as a result of being formed concurrently. The second shallow p-type well 134 is contained in a second n-type isolation layer 136. The second n-type isolation layer 136 may possibly be abutting and contiguous with the first n-type isolation layer 120 which provides the Hall plate 118 as depicted in FIG. 1. Alternatively, the second n-type isolation layer 136 may be separate from the first n-type isolation layer 120. In either case, the second n-type isolation layer 136 and the first n-type isolation layer 120 have substantially equal distributions of n-type dopants such as phosphorus as a result of being formed concurrently. The NMOS transistor 108 includes an NMOS gate structure 138 disposed over the second shallow p-type well 134. The NMOS gate structure 138 includes a gate dielectric layer disposed on the top surface 112 of the substrate 102, a gate disposed on the gate dielectric layer, and possibly gate sidewall spacers disposed on lateral surfaces of the gate. The NMOS transistor 108 includes n-channel source/drain (NSD) regions 140 disposed in the substrate 102 adjacent to, and partially underlapping, the NMOS gate structure 138. The n-type contact regions 132 of the Hall sensor 106 and the NSD regions 140 may have substantially equal distributions of n-type dopants such as phosphorus and arsenic as a result of being formed concurrently. Elements of the metal silicide 128 may be disposed on the NSD regions 140 to reduce electrical resistance to the NMOS transistor 108.

The PMOS transistor 110 is disposed over a second shallow n-type well 142 disposed in the substrate 102. The first shallow n-type wells 130 of the Hall sensor 106 and the second shallow n-type well 142 may have substantially equal distributions of n-type dopants such as phosphorus as a result of being formed concurrently. The PMOS transistor 110 includes a PMOS gate structure 144 disposed over the second shallow n-type well 142. The PMOS gate structure 144 includes a gate dielectric layer disposed on the top surface 112 of the substrate 102, a gate disposed on the gate dielectric layer, and possibly gate sidewall spacers disposed on lateral surfaces of the gate. The PMOS transistor 110 includes p-channel source/drain (PSD) regions 146 disposed in the substrate 102 adjacent to, and partially underlapping, the PMOS gate structure 144. The p-type regions 126 of the Hall sensor 106 and the PSD regions 146 may have substantially equal distributions of p-type dopants such as boron as a result of being formed concurrently. Elements of the metal silicide 128 may be disposed on the PSD regions 146 to reduce electrical resistance to the PMOS transistor 110.

A pre-metal dielectric (PMD) layer 148 is disposed over the top surface 112 of the substrate 102. The PMD layer 148 and the contacts 150 thereof may be considered part of a metallization structure of the IC 100. The PMD layer 148 may include one or more sub-layers of dielectric material, for example a PMD liner of silicon nitride on the substrate top surface 112, a layer of silicon dioxide-based material formed by a high density plasma or a chemical vapor deposition (CVD) process using tetraethyl orthosilicate (TEOS) and ozone, a layer of silicon dioxide-based material such as phosphorus silicate glass (PSG) or boron phosphorus silicate glass (BPSG), and a cap layer of silicon nitride, silicon oxynitride, silicon carbide or silicon carbide nitride. Contacts 150 are formed through the PMD layer 148 to make contact to the metal silicide 128. The contacts 150 may have metal liners of titanium and titanium nitride, and fill metals of tungsten. Layers of metal interconnects and dielectric material, not shown in FIG. 1, are disposed above the PMD layer 148 to provide electrical connections between the components of the IC 100.

Increasing the average net dopant density of the second n-type isolation layer 136 provides better electrical isolation of the NMOS transistor 108 from the p-type semiconductor material 104, while decreasing the average net dopant density of the first n-type isolation layer 120 provides higher sensitivity of the Hall sensor 106. Forming the first n-type isolation layer 120 and the second n-type isolation layer 136 to have an average net dopant density of $5 \times 10^{16}$ cm$^{-3}$ to $1 \times 10^{17}$ cm$^{-3}$ and a thickness of 0.5 microns to 1 micron advantageously provides a desired level of isolation for the NMOS transistor 108 and a desired sensitivity of the Hall sensor 106. The first shallow p-type well 124 being disposed over, and in contact with, the Hall plate 118 enables an advantageous mode of operation. During operation of the IC 100, a bias voltage may be applied to the first shallow p-type well 124 to reverse bias a pn junction between the first shallow p-type well 124 and the Hall plate 118, which may advantageously increase the sensitivity of the Hall sensor 106. For example, the first shallow p-type well 124 may be electrically coupled to the p-type semiconductor material 104 of the substrate 102, and a positive voltage applied to the Hall plate 118. Alternatively, the first shallow p-type well 124 may be floated, providing a simplified structure for the Hall sensor 106.

Referring to FIG. 2A, the field oxide 114, including elements of the field oxide 114 defining the dummy active areas 116, is formed at the top surface 112 of the substrate 102. In one version of the instant example, the field oxide 114 may be formed by an STI process, which includes etching isolation trenches in the substrate 102, filling the trenches with dielectric material and removing excess dielectric material using an oxide CMP process. In another version of the instant example, the field oxide 114 may be formed by a LOCOS process, which includes patterning a layer of silicon nitride over the top surface 112 of the substrate 102 to expose areas for the field oxide 114, forming the field oxide 114 by a thermal oxidation process, and subsequently removing the layer of silicon nitride.

An isolation mask 156 is formed over the substrate 102 to expose an area for the first n-type isolation layer 120 and an area for the second n-type isolation layer 136. The isolation mask 156 may include photoresist formed by a photolithographic process, and may optionally include an anti-reflection layer such as a bottom anti-reflection coat (BARC). In the instant example, the area for the Hall sensor 106 and the area for the NMOS transistor 108 are adjacent, so the isolation mask 156 exposes a contiguous area for the first n-type isolation layer 120 providing the Hall plate 118 and the second n-type isolation layer 136 under the NMOS transistor 108. The isolation mask 156 covers the area for the PMOS transistor 110. N-type dopants such as phosphorus are implanted into the substrate 102 where exposed by the isolation mask 156; the isolation mask 156 blocks the n-type dopants from the substrate 102. The n-type dopants may be implanted, for example, at 1000 kilo-electron volts (keV) to 2000 keV with a dose of $5 \times 10^{12}$ cm$^{-2}$ to $2 \times 10^{13}$ cm$^{-2}$. The isolation mask 156 is subsequently removed, for example by an ash process followed by a wet clean process. The implanted n-type dopants are activated by an anneal process to form the first n-type isolation layer 120 and the second n-type isolation layer 136. The anneal process may include a furnace anneal process or a rapid thermal anneal process. The furnace anneal process may include a range of anneal conditions from a temperature of 850° C. for 120 minutes to a temperature of 950° C. for 10 minutes. The rapid thermal anneal process may include a range of anneal conditions from a temperature of 1000° C. for 60 seconds to a temperature of 1100° C. for 20 seconds, in a rapid thermal processor (RTP) tool. The anneal process may be performed after the n-type dopants are implanted and before any subsequent implants, or may be performed after additional n-type dopants are implanted to form the shallow n-type wells 130 and 142 of FIG. 1 and after p-type dopants are implanted to form the shallow p-type wells 124 and 134 of FIG. 1. Concurrently forming the second n-type isolation layer 136 and the first n-type isolation layer 120 may advantageously reduce fabrication cost and complexity of the IC 100 compared to forming the n-type isolation layers separately.

Referring to FIG. 2B, a p-type well mask 158 is formed over the substrate 102 so as to expose areas for the first shallow p-type well 124 in the Hall sensor 106 and the second shallow p-type well 134 under the NMOS transistor 108. The p-type well mask 158 covers the area for the PMOS transistor 110. The p-type well mask 158 may include photoresist formed by a photolithographic process, and may optionally include an anti-reflection layer such as a BARC. P-type dopants such as boron are implanted into the substrate 102 where exposed by the p-type well mask 158. The p-type well mask 158 blocks the p-type dopants from the substrate 102. The p-type dopants may be implanted, for example, at 200 kilo-electron volts (keV) to 500 keV with a dose of $2 \times 10^{13}$ cm$^{-2}$ to $5 \times 10^{13}$ cm$^{-2}$. Additional p-type dopants may be implanted at lower energies, for example to provide punch-through, channel stop and threshold adjust layers for the NMOS transistor 108. The p-type well mask 158 is subsequently removed, for example as described in reference to the isolation mask 156 of FIG. 2A. The implanted p-type dopants are activated by an anneal process to form the first shallow p-type well 124 and the second shallow p-type well 134. The first shallow p-type well 124 extends to the Hall plate 118. The anneal process may be, for example, a furnace anneal process or a rapid thermal anneal process, as described in reference to FIG. 2A. The anneal process may be the same anneal process used to activate the implanted n-type dopants in the first n-type isolation layer 120 and the second n-type isolation layer 136, or may be a separate anneal process. Concurrently forming the first shallow p-type well 124 of the Hall sensor 106 and the second shallow p-type well 134 under the NMOS transistor 108 may advantageously further reduce fabrication cost and complexity of the IC 100 compared to forming the shallow p-type wells separately.

Referring to FIG. 2C, an n-type well mask 160 is formed over the substrate 102 so as to expose areas for the first shallow n-type wells 130 in the Hall sensor 106 and the second shallow n-type well 142 under the PMOS transistor 110. The n-type well mask 160 covers the area for the NMOS transistor 108. The n-type well mask 160 may be formed similarly to the p-type well mask 158 of FIG. 2B. N-type dopants such as phosphorus are implanted into the substrate 102 where exposed by the n-type well mask 160. The n-type well mask 160 blocks the n-type dopants from the substrate 102. The n-type dopants may be implanted, for example, at 400 kilo-electron volts (keV) to 750 keV with a dose of $2 \times 10^{13}$ cm$^{-2}$ to $8 \times 10^{13}$ cm$^{-2}$. Additional n-type dopants such as phosphorus and arsenic may be implanted at lower energies, for example to provide punch-through, channel stop and threshold adjust layers for the PMOS transistor 110. The n-type well mask 160 is subsequently removed, for example as described in reference to the isolation mask 156 of FIG. 2A. The implanted n-type dopants are activated by an anneal process to form the first shallow n-type wells 130 and the second shallow n-type well 142. The anneal process may be, for example, a furnace anneal process or a rapid thermal anneal process, as described in reference to FIG. 2A. The anneal process may be the same anneal process used to activate the implanted p-type dopants in the first shallow p-type well 124 and the second shallow p-type well 134, or may be a separate anneal process. Forming the first shallow n-type wells 130 of the Hall sensor 106 concurrently with the second shallow n-type well 142 under the PMOS transistor 110 may advantageously further reduce fabrication cost and complexity of the IC 100 compared to forming the shallow n-type wells separately.

Referring to FIG. 2D, the NMOS gate structure 138 of the NMOS transistor 108 and the PMOS gate structure 144 of the PMOS transistor 110 are formed on the substrate 102. N-type drain extensions, not shown in FIG. 2C, may be formed in the substrate 102 adjacent to the NMOS gate structure 138, and p-type drain extensions, not shown in FIG. 2C, may be formed in the substrate 102 adjacent to the PMOS gate structure 144. An NSD (N source/drain) mask 162 is formed over the substrate 102 so as to expose areas for the n-type contact regions 132 in the Hall sensor 106 and the NSD regions 140 of the NMOS transistor 108. The NSD mask 162 covers the area for the PMOS transistor 110. The NSD mask 162 may include photoresist formed by a photolithographic process, and may include an anti-reflection layer such as a BARC. N-type dopants such as phosphorus and arsenic, and possibly antimony, are implanted into the substrate 102 where exposed by the NSD mask 162. The NSD mask 162 blocks the n-type dopants from the substrate 102. The n-type dopants may be implanted in more than one implant step with implant energies ranging, for example, from 20 keV to 60 keV and with a total dose of $1 \times 10^{15}$ cm$^{-2}$ to $4 \times 10^{15}$ cm$^{-2}$. The NSD mask 162 is subsequently removed, for example as described in reference to the isolation mask 156 of FIG. 2A. The implanted n-type dopants are activated by an anneal process to form the n-type contact regions 132 and the NSD regions 140. The anneal process may be, for example, a rapid thermal anneal process as described in reference to FIG. 2A, or a flash anneal process. An example flash anneal process uses radiant energy to heat the substrate 102 at the top surface 112 to a temperature of 1200° C. to 1250° C. for 1 millisecond to 5 milliseconds. Forming the n-type contact regions 132 of the Hall sensor 106 concurrently with the NSD regions 140 of the NMOS transistor 108 may advantageously further reduce fabrication cost and complexity of the IC 100 compared to forming the n-type regions separately.

Referring to FIG. 2E, a PSD (P source/drain) mask 164 is formed over the substrate 102 so as to expose areas for the p-type regions 126 in the Hall sensor 106 and the PSD regions 146 of the PMOS transistor 110. The PSD mask 164 covers the area for the NMOS transistor 108. The PSD mask 164 may be formed similarly to the NSD mask 162 of FIG. 2D. P-type dopants such as boron and gallium, and possibly indium, are implanted into the substrate 102 where exposed by the PSD mask 164. The PSD mask 164 blocks the p-type dopants from the substrate 102. The p-type dopants may be implanted in more than one implant step with implant energies ranging, for example, from 3 keV to 20 keV and with a total dose of $1 \times 10^{15}$ cm$^{-2}$ to $4 \times 10^{15}$ cm$^{-2}$. The PSD mask 164 is subsequently removed, for example as described in reference to the isolation mask 156 of FIG. 2A. The implanted p-type dopants are activated by an anneal process to form the p-type regions 126 and the PSD regions 146. The anneal process may be, for example, a rapid thermal anneal process or a flash anneal process, and may be performed concurrently with the anneal process for the n-type contact regions 132 and the NSD regions 140. Forming the p-type regions 126 of the Hall sensor 106 concurrently with the PSD regions 146 of the PMOS transistor 110 may advantageously further reduce fabrication cost and complexity of the IC 100 compared to forming the p-type regions separately.

A Hall sensor analogous to that disclosed in reference to FIG. 1 and FIG. 2A through FIG. 2E may be formed with a p-type Hall plate (not shown), by appropriate changes in polarities of dopants and conductivity types.

Referring to FIGS. 2F-2L, the fabrication processing continues with formation of a metallization structures including a PMD layer 148 and one or more further metallization layers, with the AMR sensor or sensors 182 being formed in one of the metallization layers. As seen in FIG. 2F, metal silicide 128 is formed on exposed semiconductor material at the top surface 112 of the substrate 102. In FIG. 2G, the PMD layer 148 and the contacts 150 are formed to provide interconnection to the transistor-layer structures and the connections to the horizontal Hall sensor 106. FIG. 2H shows the IC 100 after formation of a metallization layer 160 including an inter-layer dielectric (ILD) 148 with patterned first metal structures 162 contacting or electrically coupling with one or more of the PMD-layer contacts 150, and conductive contacts 164 extending to the top of the ILD 148. In addition, a second metal layer is formed in this example, including ILD material 170, patterned metal structures 172 and contacts 174. In FIG. 2I, fabrication of a final or uppermost metallization layer begins with fabrication of patterned conductive metal structures 182. In one example, a titanium nitride (TiN) layer 194 is formed at the tops of the structures 182 as shown in FIG. 2I. Continuing in FIG. 2J, a first portion of a top ILD material layer 180A is formed to cover the top of the metallization layer 170 and the structures 182, 194. Tungsten (W) vias 192 are formed to contact portions of the titanium nitride layer 194 above AMR sensor structures 182, 194.

Referring to FIG. 2K, a thin-film-resistor (TFR) type process is used in one example to form an AMR sensor stack for each of a plurality of AMR sections 184. In this example, eight such section structures 184 are formed, including two sets of four sections 184 interconnected via the metallization structure to form to bridge circuits. As seen in FIG. 2K, the individual AMR sections 184 extend parallel to the top surface 112 of the substrate 102 from a first section end (e.g., left in FIG. 2K) to a second section end (e.g., right in FIG. 2K). The individual AMR sections 184 include a tantalum nitride (TaN) base layer 186 which is electrically coupled with one or more of the vias 192 proximate the first section end, and the base layer 186 is electrically coupled with one or more of the vias 192 proximate the second section end. In other examples (e.g., FIGS. 4 and 5 below), the base layer 186 can be formed over portions of the titanium nitride layers 194, and the vias 192 can be omitted. The AMR section stacks 184 further include a nickel iron (NiFe) alloy layer 188 extending over at least a portion of the base layer 186, and an aluminum nitride (AlN) layer 190 extending over at least a portion of the nickel iron alloy layer 188. The use of the tungsten vias 192 and the formation of the stacks 184 adds two masks to the fabrication process in one example. In practice, the base layer 186 operates as a seed layer to promote nickel iron alloy (111) crystalline texture, and provides protection of the nickel iron alloy layer 188 against oxidation or chemical reaction. As the seed or base layer 186 may be desired to be resistive, is preferred in certain examples to minimize the thickness of the base layer 186 while maintaining the benefit of enhancing the nickel iron (111) crystalline texture. The nickel iron alloy layer provides the source of magnetoresistive (MR) effect, and preferably maximizes the current flow through the layer 188, wherein one suitable material is a weight percentage alloy material $Ni_{82}Fe_{18}$. The aluminum nitride layer 190 operates as a capping layer to protect the nickel iron alloy 188 against oxidation or chemical reaction, and in operation does not need to be conductive. Because electrical connection is made from the bottom of the AMR stack 184, a non-metallic layer 190 (e.g., aluminum nitride) can be used, thereby mitigating current shunting through the layer 190.

Referring now to FIG. 2L, the top metallization layer is finished with the addition of further ILD material 180, and one or more passivation layers or structures or processors may be provided with formation of final external pads or contacts on the upper side of the IC 100 in order to provide interconnection to a host printed circuit boards (not shown) or the like.

Referring now to FIG. 2M, a portion of the IC 100 is illustrated, schematically showing interconnection of the horizontal Hall sensor 106 with associated Hall sensor circuitry, including a current source 152 and a voltage sensor or readout (e.g., amplifier circuit) 154 to sense a Hall voltage on a Hall plate. In this example, the Hall sensor 106 includes four terminals or connections T1, T2, T3 and T4, with T1 and T3 being connected to the current source 152 to provide a current I to the Hall plate 118 via corresponding contacts 150 and the N-type contact regions 132. The voltage readout 154 is electrically coupled with the Hall sensor 106 through other contacts 150, out of the plane of FIG. 2M in the instant example. During operation of the IC 100, the current source 152 provides a current I through the Hall plate 118, and the voltage readout 154 senses a Hall voltage on the Hall plate 118 which is a function of a magnetic field through the Hall plate 118 and provides an electrical output which is a function of the Hall voltage. Providing at least one of the current source 152 and the voltage readout 154 in the IC 100 may advantageously reduce a cost and complexity of a system including the IC 100. In one example, the current source 152 and the voltage readout 154 are constructed using transistors and other circuit components (e.g., resistors, capacitors, etc.) formed during fabrication of the transistors in the IC 100, and the IC 100 can provide an externally accessible pin or pad (not shown) allowing a host circuit to receive the sensed Hall voltage from the voltage readout 154. Moreover, processing to create the transistors and the Hall sensor 106 on or in the substrate 102 in this example also includes fabrication of other circuitry associated with the AMR sensor or sensors 182, for example, including connections or contacts in the metallization structure to interconnect various AMR sections with one another to form one or more bridge circuits, as well as voltage sources to power the bridge circuits and voltage readouts to sense one or more bridge voltages to provide AMR sensor output signals, which can be interconnected for external accessibility by a host PCB.

Referring to FIG. 2N, a top view of the example IC 100 is shown, where the uppermost metallization layer 180 includes first and second AMR sensor structures 182A and 182B. As seen in FIG. 2N, the voltage sensing connections T2 and T4 of the Hall sensor 106 are latterly disposed in a "Y" direction in the IC 100, and the current source connection terminals T1 and T3 are longitudinally disposed along the "X" direction in this example. In this manner, the Hall sensor 106 is a horizontal Hall sensor structure adapted for sensing magnetic fields oriented perpendicular to the top surface 112 of the substrate 102. In addition, the individual AMR sensors 182A and 182B in this example include at least four AMR sections 184 individually formed as the stacks 184 shown in FIGS. 1, 2K and 2L above. The sections 184 of the sensors 182A and 182B are angularly offset from one another by 45°. In this case, the first and second AMR sensors 182A and 182B are sensitive to magnetic fields oriented parallel to the top surface 112 of the substrate 102, and the signals from the corresponding first and second bridge circuits provide a range of 180° for rotational sensing. In combination with the horizontal Hall sensor circuit 106, which is sensitive to magnetic fields perpendicular to the top surface 112, a host system can detect rotation through 360° using the signals from the two AMR sensor bridge circuits and the Hall sensor 106. Moreover, the angular offsetting of the AMR sensors 182 by 45°, and the perpendicular orientation of the sensors 182 relative to the sensing direction of the hall sensor 106 can be precisely controlled using the semiconductor fabrication processing to a degree that is impractical or impossible using mechanical means to control the relative orientation of two or more discrete sensors as was done in the past. Accordingly, the wafer-scale integration of the hall sensor or sensors 106 with the AMR sensor or sensors 182 of the present disclosure provides significant advantages relative to conventional rotation and/or position sensing techniques.

Figure 3A:
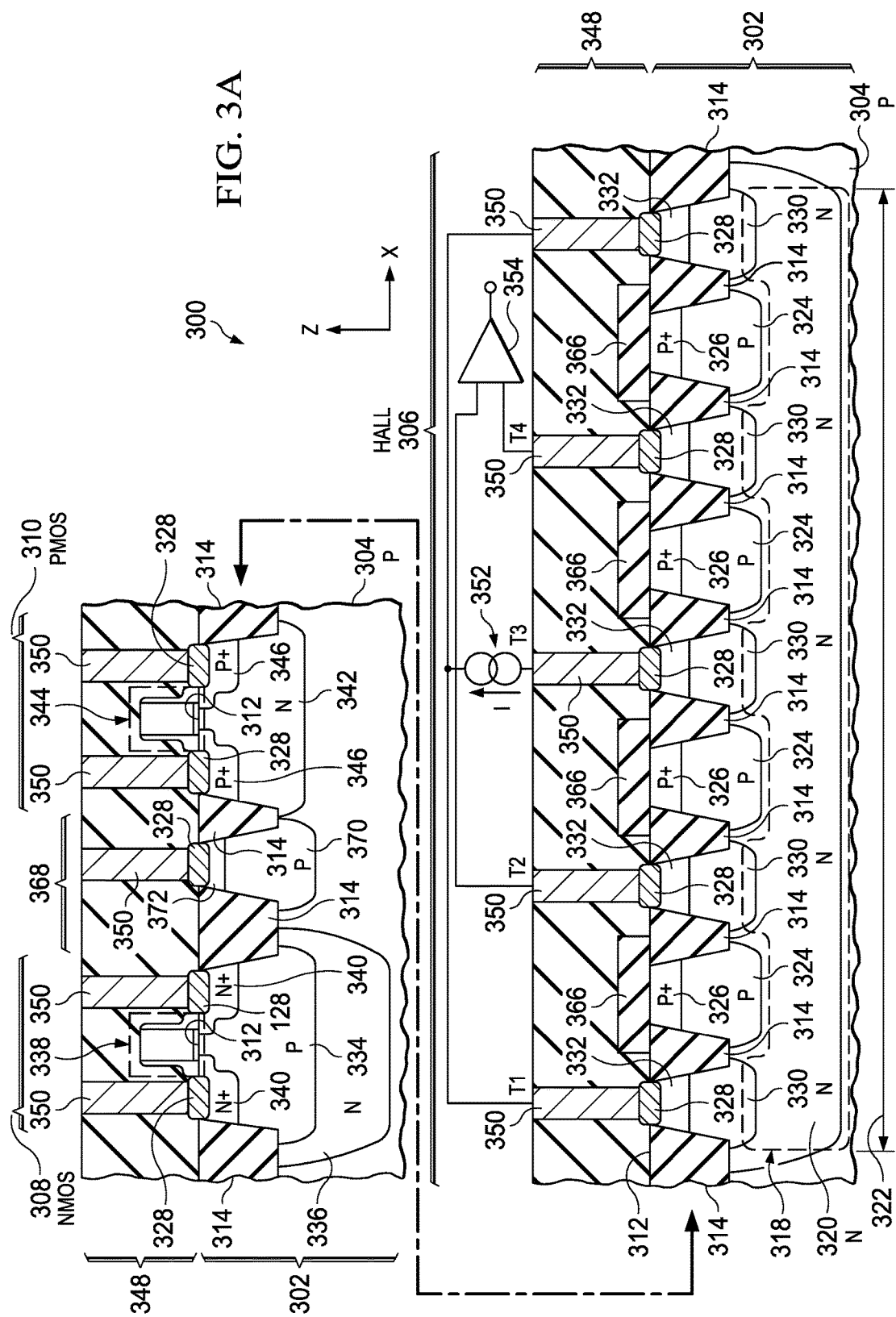
FIG. 3A is a partial sectional side elevation view of another example IC including a vertical Hall sensor, schematically illustrating a current source and voltage readout to interface with the vertical Hall sensor.
Figure 3B:
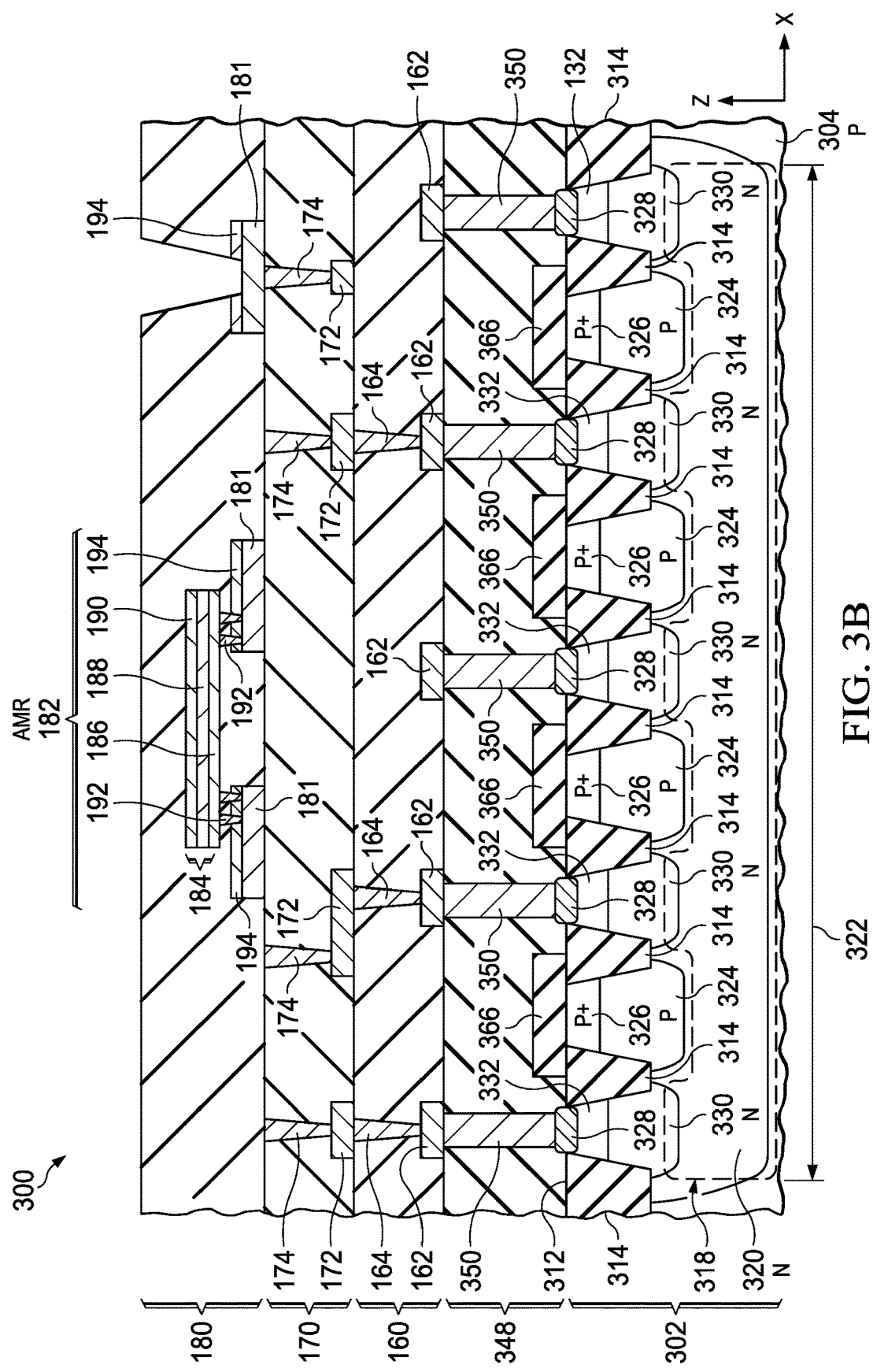
FIG. 3B is a partial sectional side elevation view of the IC of FIG. 3A including vertical Hall sensor along with an AMR sensor formed in an upper metallization layer.
Figure 3C:
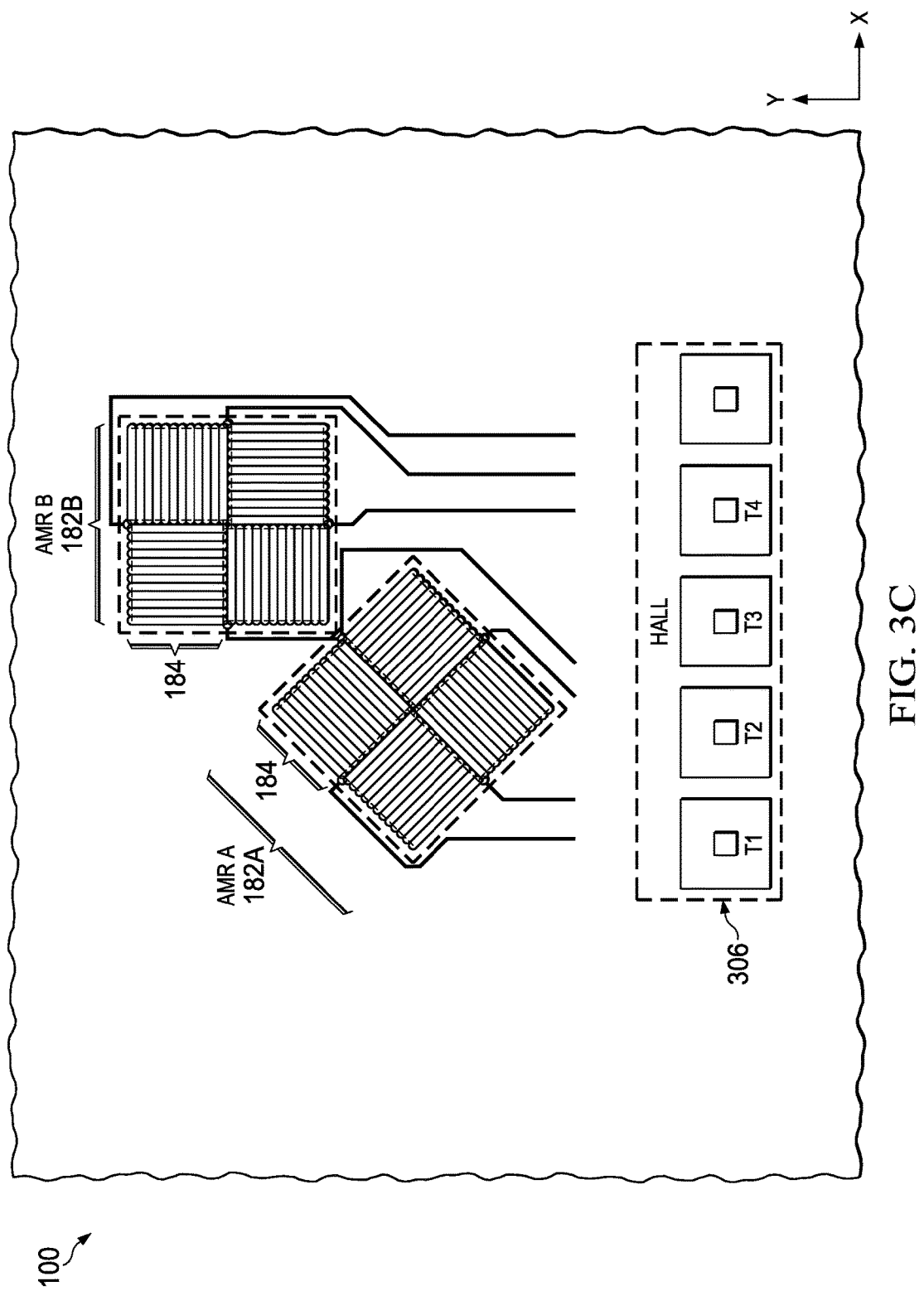
FIG. 3C is a partial top plan view of the IC of FIGS. 3A and 3B.

Referring to FIGS. 3A-3C, another example IC 300 is illustrated including a vertical Hall sensor 306 and one or more AMR sensors 182. In this example, the AMR sensors 182 in the IC 300 are fabricated as described above in connection with FIGS. 2F-2L, including to sensors 182A and 182B with sections 184 offset from one another by 45° to form two separate bridge circuits. The IC 300 has a substrate 302 including a p-type semiconductor material 304. The IC 300 includes a vertical Hall sensor 306 for sensing magnetic fields oriented parallel to a top surface 312 of the substrate 302, as well as an NMOS transistor 308 and a PMOS transistor 310 as shown in FIG. 3A. The IC 300 may include field oxide 314 disposed at the top surface 312 of the substrate 302 to laterally isolate components and elements. The vertical Hall sensor 306 includes a Hall plate 318 disposed in a first n-type isolation layer 320 in the substrate 302. An average net dopant density of the Hall plate 318 may be, for example, $5 \times 10^{16}$ cm$^{-3}$ to $1 \times 10^{17}$ cm$^{-3}$. A thickness of the Hall plate 318 may be 0.5 microns to 1 micron. The average net dopant density and the thickness may provide a sheet resistance of 850 ohms per square to 2500 ohms per square of the Hall plate 318. A lateral length 322 of the Hall plate 318 may be, for example, 50 microns to 125 microns for a vertical Hall sensor. Forming the Hall plate 318 with the lateral length 322 of 50 microns to 125 microns may provide a desired balance between sensitivity and cost. The Hall sensor 306 includes first shallow p-type wells 324 disposed in the substrate 302 over, and extending to, the Hall plate 318. The first shallow p-type wells 324 may extend below the field oxide 314 and may possibly be contiguous at locations out of the plane of FIG. 3A. The first shallow p-type wells 324 may be biased or floated, as described in reference to the first shallow p-type well 124 of FIG. 1, accruing the advantages disclosed therein. Various structures may be disposed in and/or over the first shallow p-type wells 324 over the Hall plate 318. In the instant example, p-type regions 326 may be disposed in the first shallow p-type wells 324 and a layer of silicide block dielectric 366 disposed over the p-type regions 326. Electrical connections to the Hall plate 318 may be provided by first shallow n-type wells 330 disposed in the substrate 302. FIG. 3A depicts four example connections or terminals T1-T4 for electrical connection of a current source 352 and a voltage readout 354 to the Hall plate 318 to form a vertical Hall sensor circuit. The Hall sensor 306 may include additional connections. The first shallow n-type wells 330 may be laterally separated from the first shallow p-type wells 324 by elements of the field oxide 314. N-type contact regions 332 may be disposed in the substrate 302 over the first shallow n-type wells 330 to reduce electrical resistance to the Hall plate 318. Elements of the metal silicide 328 may be disposed over the n-type contact regions 332 to further reduce electrical resistance to the Hall plate 318.

The NMOS transistor 308 is disposed over a second shallow p-type well 334 disposed in the substrate 302. The first shallow p-type wells 324 of the Hall sensor 306 and the second shallow p-type well 334 have substantially equal distributions of p-type dopants such as boron as a result of being formed concurrently, for example as described in reference to FIG. 2B. The second shallow p-type well 334 is contained in a second n-type isolation layer 336, which may be separate from the first n-type isolation layer 320 which provides the Hall plate 318 as depicted in FIG. 3A. Alternatively, the second shallow p-type well 334 may be contained in a common n-type isolation layer which provides the Hall plate 318, as described in reference to FIG. 1. In either case, the second n-type isolation layer 336 containing the second shallow p-type well 334 and the first n-type isolation layer 320 which provides the Hall plate 318 have substantially equal distributions of n-type dopants such as phosphorus as a result of being formed concurrently, for example as described in reference to FIG. 2A. The NMOS transistor 308 includes an NMOS gate structure 338 disposed over the second shallow p-type well 334 and NSD regions 340 disposed in the substrate 302 adjacent to, and partially underlapping, the NMOS gate structure 338, similar to that described in reference to FIG. 1. The n-type contact regions 332 of the Hall sensor 306 and the NSD regions 340 may have substantially equal distributions of n-type dopants such as phosphorus and arsenic as a result of being formed concurrently, for example as described in reference to FIG. 2D. Elements of the metal silicide 328 may be disposed on the NSD regions 340 to reduce electrical resistance to the NMOS transistor 308.

The PMOS transistor 310 is disposed over a second shallow n-type well 342 disposed in the substrate 302. The first shallow n-type wells 330 of the Hall sensor 306 and the second shallow n-type well 342 may have substantially equal distributions of n-type dopants such as phosphorus as a result of being formed concurrently, for example as described in reference to FIG. 2C. The PMOS transistor 310 includes a PMOS gate structure 344 and PSD regions 346 disposed in the substrate 302 adjacent to, and partially underlapping, the PMOS gate structure 344, similar to that described in reference to FIG. 1. The p-type regions 326 of the Hall sensor 306 and the PSD regions 346 may have substantially equal distributions of p-type dopants such as boron as a result of being formed concurrently, for example as described in reference to FIG. 2E. Elements of the metal silicide 328 may be disposed on the PSD regions 346 to reduce electrical resistance to the PMOS transistor 310.

The IC 300 may also include a substrate tap 368 which provides an electrical connection to the p-type semiconductor material 304. The substrate tap 368 includes a third shallow p-type well 370 disposed in the substrate 302. The first shallow p-type wells 324 of the Hall sensor 306 and the third shallow p-type well 370 have substantially equal distributions of p-type dopants such as boron as a result of being formed concurrently, for example as described in reference to FIG. 2B. The substrate tap 368 also includes a p-type contact region 372 disposed in the third shallow p-type well 370. The p-type regions 326 of the Hall sensor 306 and the p-type contact region 372 may have substantially equal distributions of p-type dopants such as boron as a result of being formed concurrently, for example as described in reference to FIG. 2E. An element of the metal silicide 328 may be disposed on the p-type contact region 372 to reduce electrical resistance to the p-type semiconductor material 304. A Hall sensor analogous to that disclosed in reference to FIG. 3A may be formed with a p-type Hall plate, by appropriate changes in polarities of dopants and conductivity types.

As further shown in FIG. 3B, a PMD layer 348 and contacts 350, for example as described in reference to FIG. 1, are disposed over the top surface 312 of the substrate 302. Metallization layers 160, 170 and 180 of metal interconnects and dielectric material are disposed above the PMD layer 348 to provide electrical connections between the components of the IC 300, as generally described above in connection with FIG. 1. In addition, the metallization structure includes one or more AMR sensors 182 as previously described. In operation, the current source 352 (FIG. 3A) is electrically coupled to the Hall sensor 306 and the voltage readout 354 is electrically coupled to the Hall sensor 306. In operation, the current source 352 provides a current through the Hall plate 318, and the voltage readout 354 senses a Hall voltage on the Hall plate 318 which is a function of a magnetic field through the Hall plate 318 that is oriented parallel to the top surface 312 of the substrate 302, and the Hall plate 318 provides an electrical output sensed by the voltage readout 354 to provide an output signal that is a function of the Hall voltage.

As further shown in FIG. 3C, the vertical Hall sensor 306 is combined with the first and second AMR sensors 182A and 182B, and the bridge circuit output signals from the 45° offset sensors 182 can be used to provide 180° of rotational sensing range, in combination with a polarity detection by the voltage output provided by the vertical Hall sensor circuit 306, to yield the capability of 360° rotational sensing using the IC 300.

Figure 4:
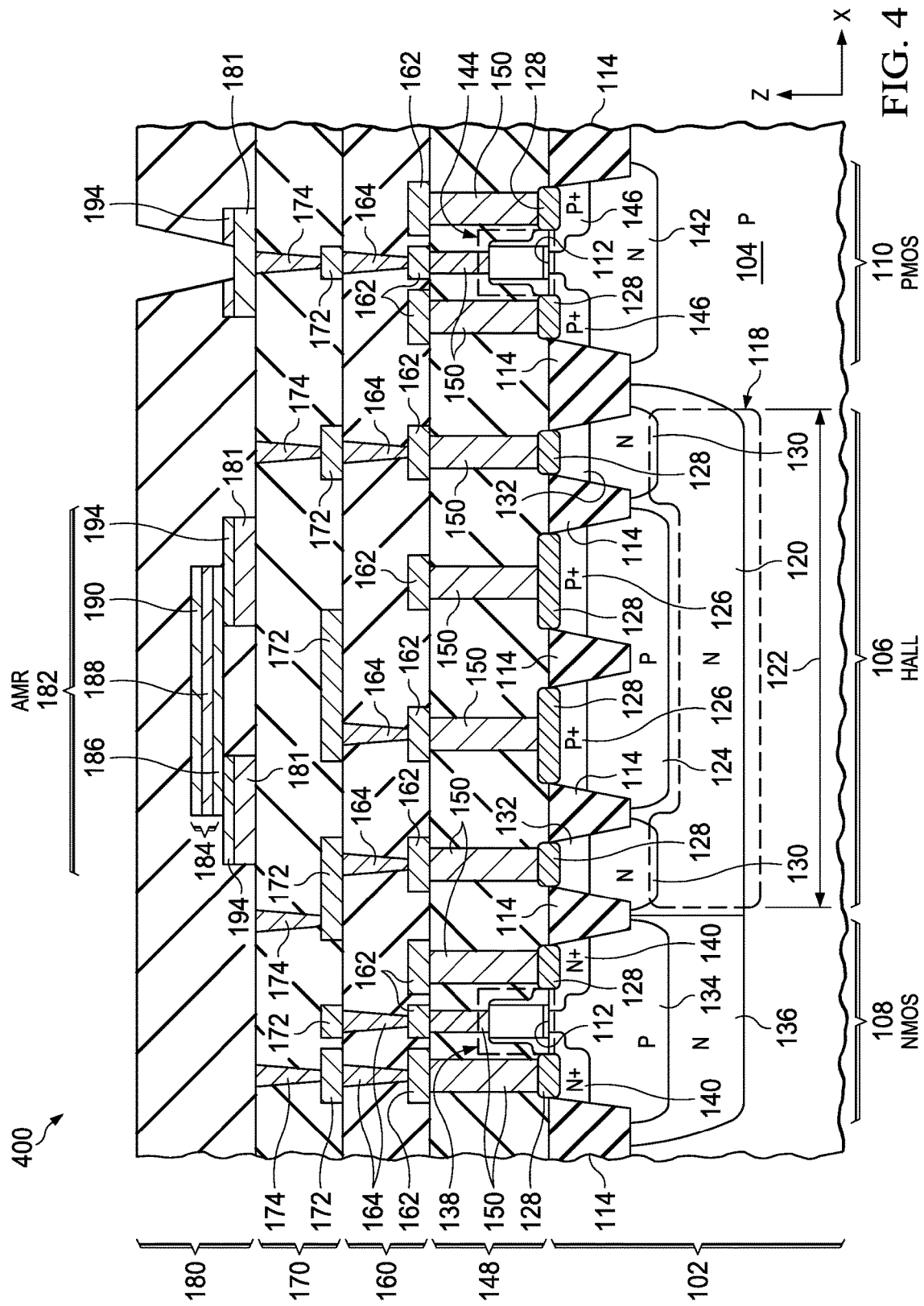
FIG. 4 is a partial sectional side elevation view of another example IC including a horizontal Hall sensor and an AMR sensor.

Referring to FIG. 4, another example IC 400 includes a horizontal Hall sensor 106 as described above in connection with FIG. 1, as well as another example AMR sensor 182. Unlike the example in FIG. 1 above, the AMR sensors 182 in FIG. 4 do not include the vias, with the base layer 186 (e.g., tantalum nitride) directly contacting the titanium nitride layers 194 of the associated metal structures 182. Because electrical connection is made from the bottom of the AMR stack 184 in the IC 400, a non-metallic layer 190 (e.g., aluminum nitride) can be used, thereby mitigating current shunting through the layer 190.

Figure 5:
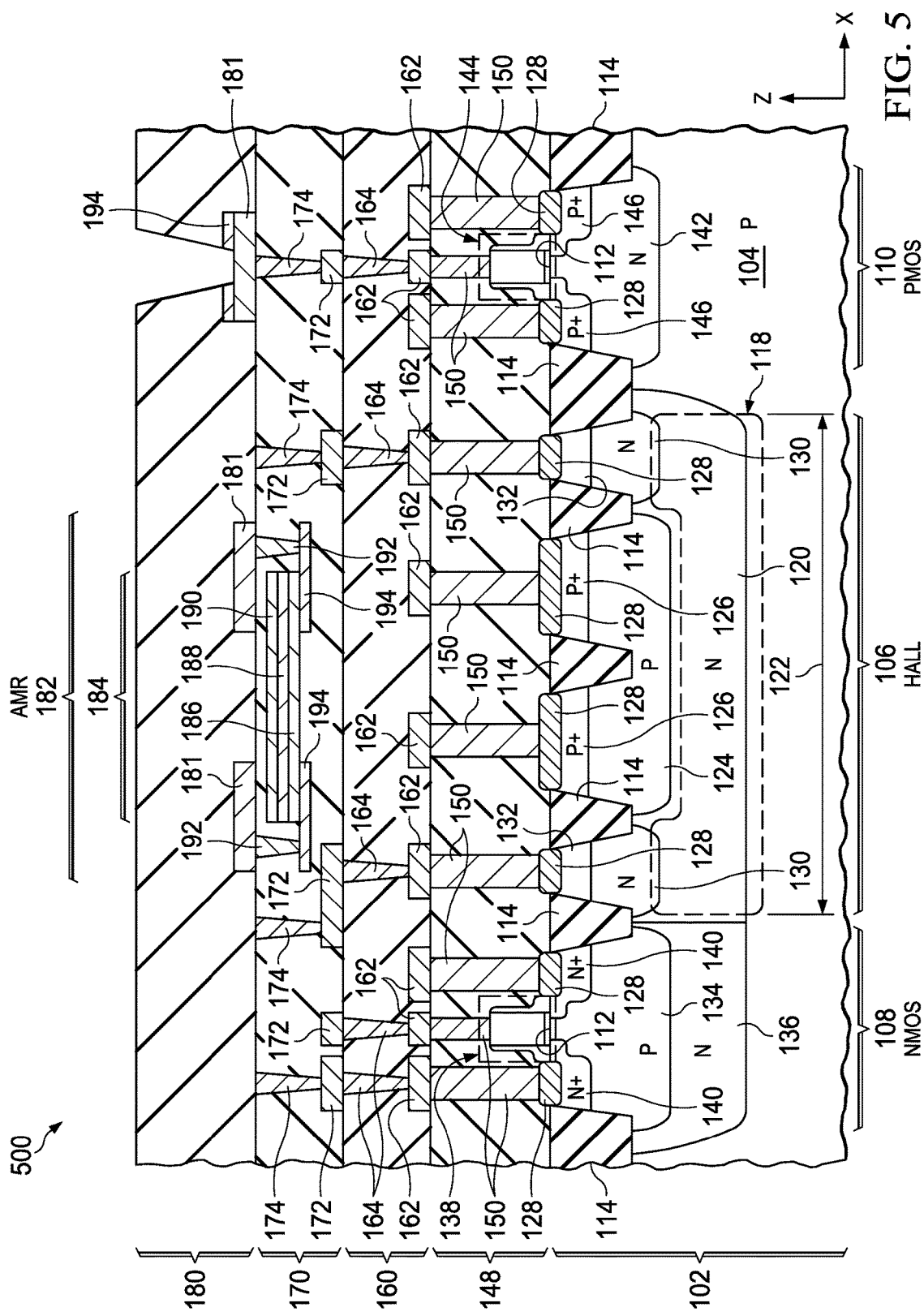
FIG. 5 is a partial sectional side elevation view of yet another example IC including a horizontal Hall sensor and an AMR sensor.

FIG. 5 shows another example IC 500 including a horizontal Hall sensor 106 as previously described, as well as a further example AMR sensor 182. In this example, one or more AMR sensors 182 are formed in the second metallization layer 170 with electrical coupling to metallization structures 181 and the upper metal layer 180. The AMR sensor segments 184 are constructed as described above in connection with FIG. 2K, including a base layer 186 (tantalum nitride), a nickel iron alloy layer 188 extending over at least a portion of the base layer 186, and an aluminum nitride capping layer 190 extending over at least a portion of the nickel iron alloy layer 188. In this case, end portions of the base layer 186 are formed over titanium nitride features 194 in the second metal layer 170 as shown in FIG. 5, and the titanium nitride features 194 are electrically coupled with the structures 181 in the top metal layer 180 by tungsten via structures 192 in the second metal layer 170. As with the above AMR sensor stack examples, the use of non-metallic capping layer 190 avoids or mitigates current shunting through the capping layer 190, with the electrical connection made from the bottom of the AMR stack 184.

In the examples of FIGS. 4 and 5, a horizontal Hall sensor 106 is provided on or in the substrate 102 as described above in connection with FIG. 1, although a vertical Hall sensor (e.g., sensor 306 above) can instead be used, or combinations of vertical and horizontal Hall sensors can be provided in other examples. When a vertical Hall sensor is combined with a horizontal Hall sensor and magnetoresistive sensors, 3-D position sensing is also possible using the IC 100. Moreover, the AMR sensors 182 can be constructed to form two separate AMR bridge circuits in certain examples, offset by 45° from one another as previously described, or multiple Hall sensors (e.g., vertical and/or horizontal) can be combined with a single AMR sensor 182 in various alternate implementations.

Figure 6:
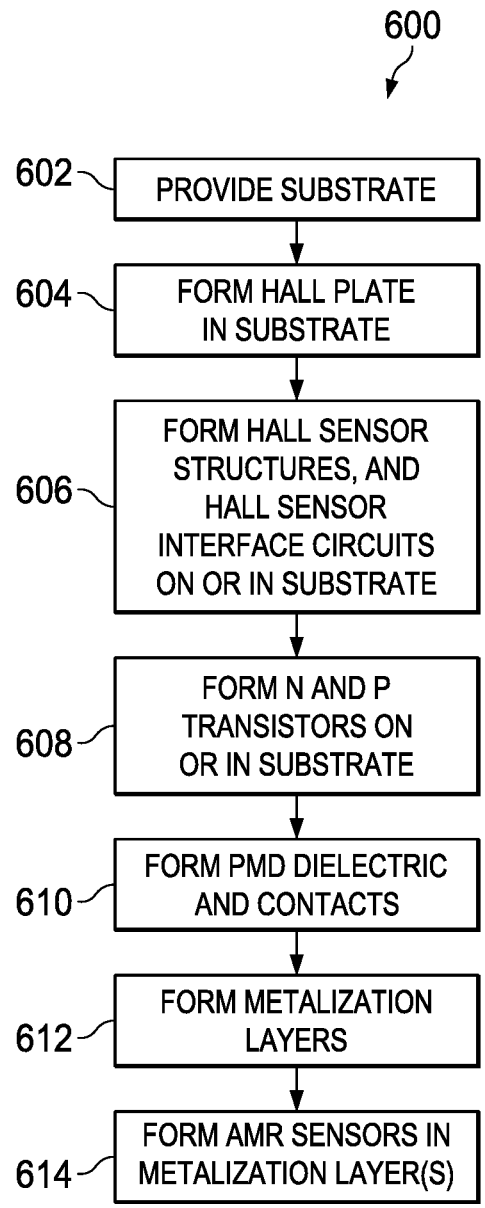
FIG. 6 is a flow diagram illustrating an example method of fabricating an IC.

FIG. 6 provides a flow diagram illustrating an example IC fabrication method 604 which may be used in making one or more of the disclosed IC examples 100, 300, 400, 500. At 602 in FIG. 6, a substrate is provided, such as the above-described substrates 102, 302. A Hall plate is formed at 604 in the substrate, for example, using the above-described processing techniques to form the Hall plate structures 118, 318, with the Hall plate 118, 318 extending parallel to a top surface (e.g., 112, 312) of the substrate. At 606, Hall sensor structures and Hall sensor interface circuits are formed on or in the substrate 102, 302, and N and P transistors are formed at 608 on or in the substrate 102, 302. At 610, a pre-metal dielectric (PMD) is formed, and associated contacts are formed, such as the PMD layer 148 and associated contacts 150 in the above-described examples. At 612, one or more metallization layers are formed, such as the metal layers 160, 170 and 180 described above. At 614 in FIG. 6, one or more magnetoresistive sensors (e.g., AMR sensors 182) are formed in the metallization structure. In one example, as previously discussed, the AMR sensor or sensors can be formed at 614 in a top metallization layer 180 of the metallization structure 146, 160, 170, 180. In various implementations, as described above, the AMR sensor circuit 182 can be formed at 614 including multiple AMR sensor sections 184 connected in a bridge circuit, with individual AMR sections 184 extending parallel to the top surface 112, 312 of the substrate 102, 302. Any suitable magnetoresistive section structures can be formed at 614, including the above-described AMR section stacks 184 including a base layer (e.g., tantalum nitride), a nickel iron alloy layer 188 extending over at least a portion of the base layer to provide a magnetoresistive conducting portion, as well as a capping layer 190 (e.g., aluminum nitride), with suitable electrical couplings to join respective ends of the AMR sensor sections 184 to form one or more bridge circuits. In addition, and certain implementations, the AMR sensor circuits 182 are formed in the metallization structure at least partially above the Hall effect sensor circuit formed at 604, 606.

Figure 7:
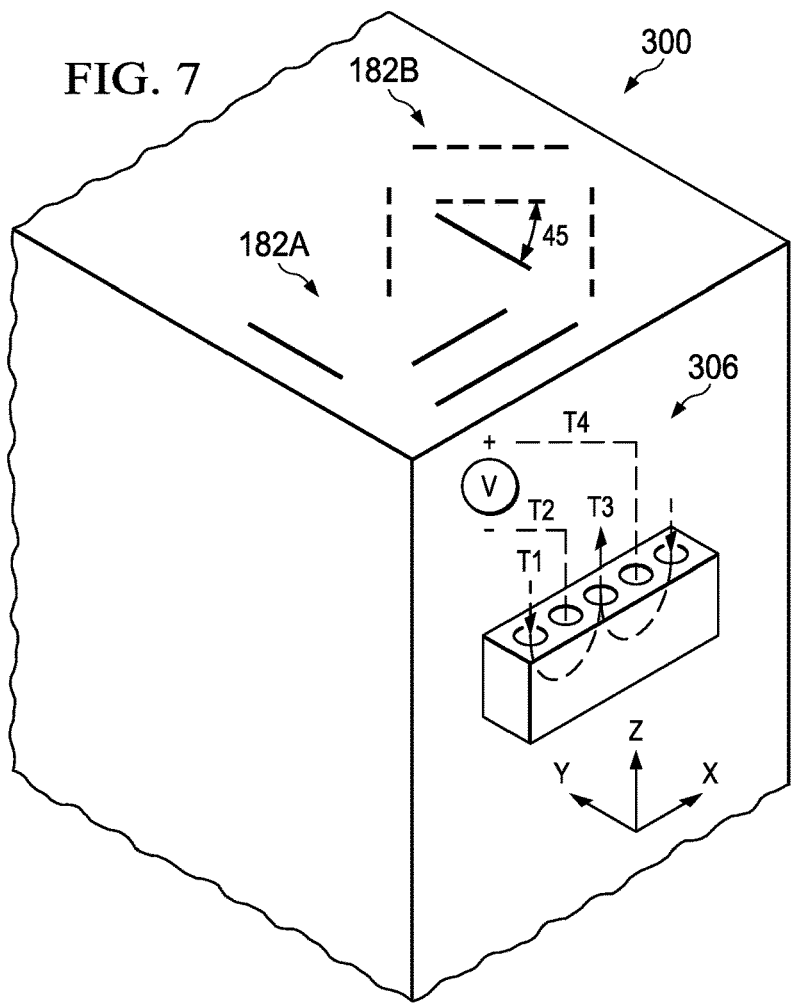
FIG. 7 is a partial perspective view illustrating an IC example including a vertical Hall sensor disposed below first and second AMR sensors.
Figure 8:
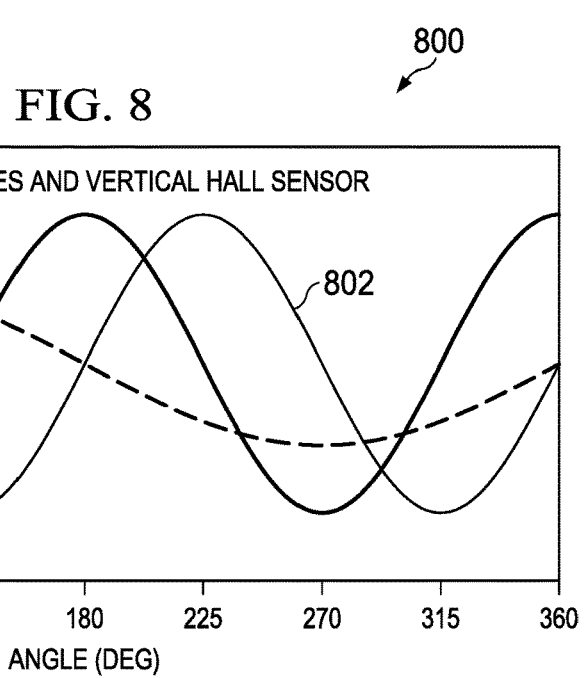
FIG. 8 is a graph illustrating sensor voltage signals from the first and second AMR sensors and the vertical Hall sensor in the IC of FIG. 7.

Referring now to FIGS. 7 and 8, FIG. 7 illustrates further details of the IC 300 previously described in connection with FIGS. 3A-3C, including a vertical Hall sensor 306 and a pair of 45° offset AMR sensors 182A and 182B, in which the AMR sensors 182 are formed substantially above the Hall effect sensor 306. FIG. 8 provides a graph 800 illustrating sensor voltage signals 802 and 804, respectively from the AMR sensor the bridge circuits 182B and 182A in FIG. 7, as well as a sensor voltage output signal waveform 806 from the vertical Hall sensor 306 in the IC 300 of FIG. 7. In this example, the two Wheatstone bridge circuits of AMR sensors 182A and 182B, offset from each other by 45° in the X-Y plane of the IC 300 provide high-precision detection of 180° of rotation. The additional polarity information provided by the vertical Hall effect sensor 306 (curve 806 in FIG. 8) is combined with the 180° rotation detection range of the AMR sensors 182A and 182B to facilitate detection of a full 360° rotation range with high precision.

Figure 9:
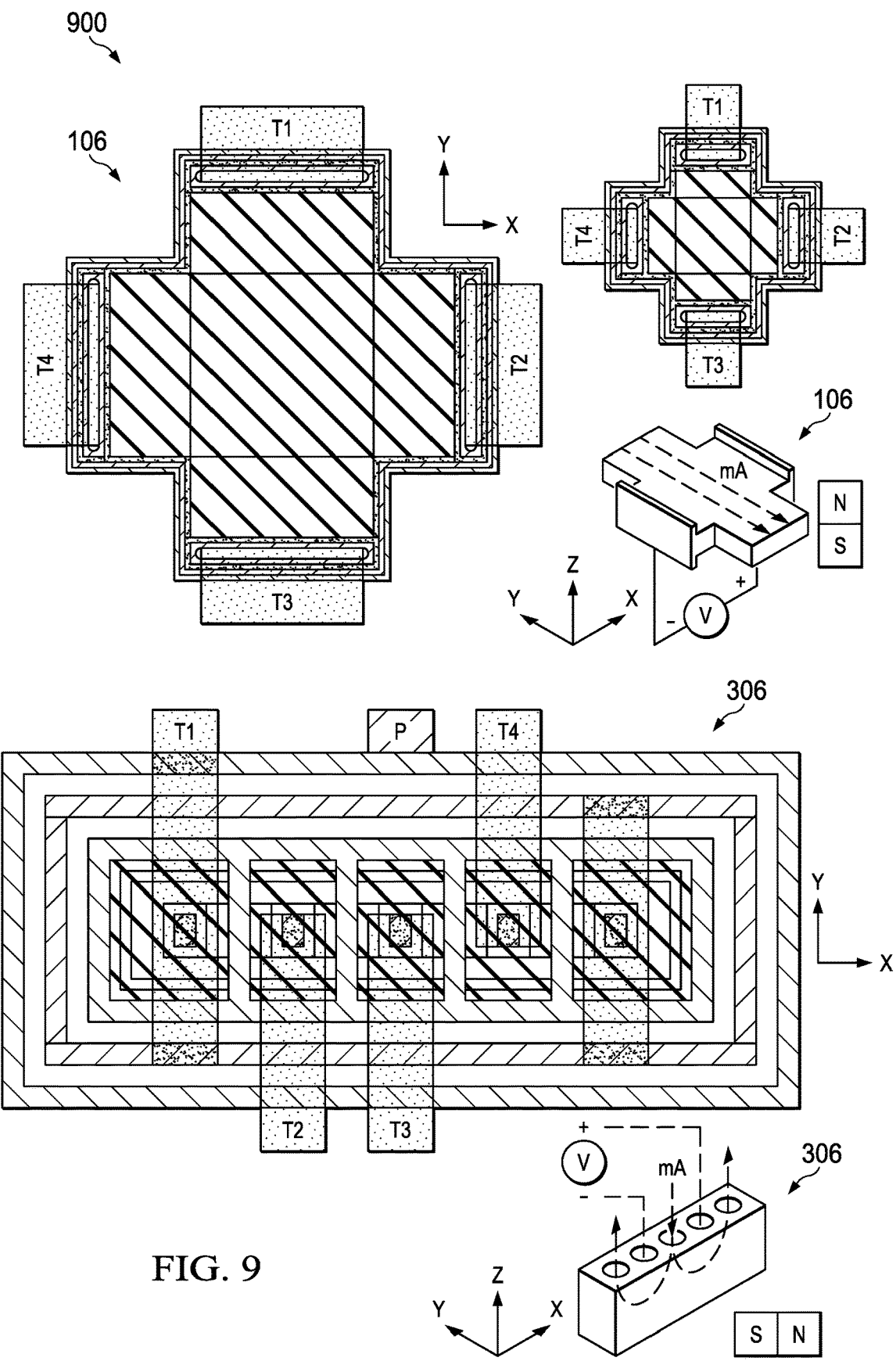
FIG. 9 illustrates another example IC including vertical and horizontal Hall sensors.

FIG. 9 illustrates another example IC 900 including a vertical Hall sensor 306 and a horizontal Hall sensor 106. In this case, the vertical Hall sensor 306 senses magnetic fields oriented parallel to the top surface of the substrate of the IC, in this case magnetic fields parallel to the X-Y plane shown in FIG. 9. The horizontal Hall sensor 106 is operative to sense magnetic fields oriented perpendicular to the top surface of the substrate, in this case fields perpendicular to the X-Y plane indicated in FIG. 9.

Figure 10:
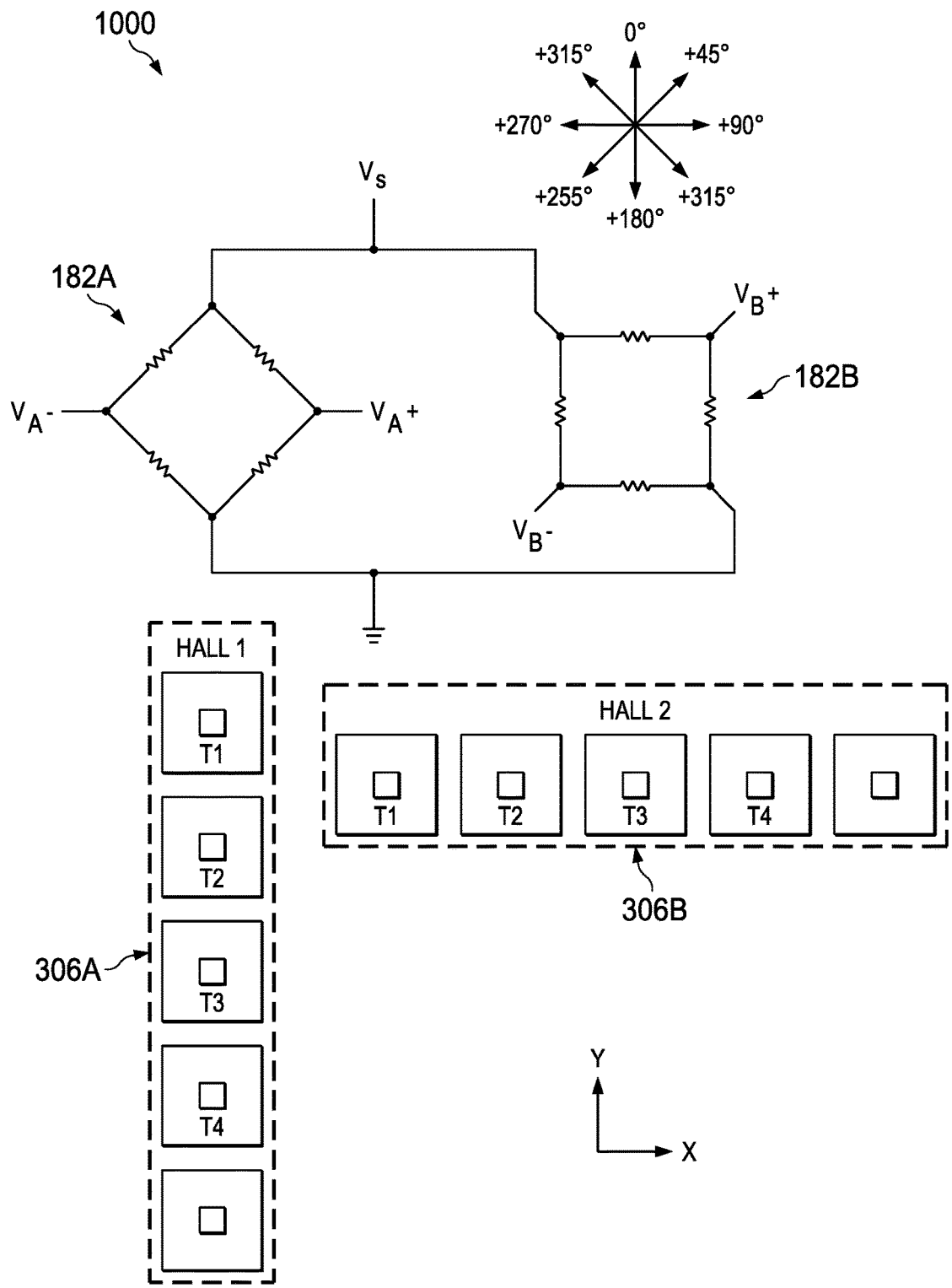
FIG. 10 is a partial schematic diagram illustrating another example IC including orthogonal first and second vertical Hall sensors and first and second AMR sensors with AMR segments connected in first and second bridge circuits.

Referring now to FIGS. 10 and 11, FIG. 10 shows a simplified schematic top view of another example IC 1000 including first and second AMR sensor bridge circuits 182A and 182B offset from one another by 45°, and providing magnetoresistive sensing of magnetic fields oriented parallel to a top surface of the substrate, in this case parallel to the X-Y plane indicated in FIG. 10. This example also includes first and second vertical Hall sensors 306A and 306B, each capable of sensing magnetic fields oriented parallel to the top surface of the substrate. In this case the first Hall sensor 306A is sensitive to magnetic fields in the "X" direction, and the second vertical Hall sensor 306B is sensitive to magnetic fields oriented in the "Y" direction indicated in FIG. 10. FIG. 11 provides a graph 1100 showing AMR sensor output signals 1102 and 1104 respectively corresponding to the sensors 182B and 182A in FIG. 10. The graph 1100 further illustrates first and second Hall sensor output signal waveforms 1106 and 1108, respectively corresponding to the first Hall sensor 306A and the second Hall sensor 306B shown in FIG. 10. In this case, the use of two vertical Hall sensors 306 provides before output signals 1102-1108 with the first Hall sensor output signal 1106 being used from 45° through 135° and again from 225° through 315° for rotation sensing. The second Hall sensor output signal 1108 is used from 135° through 225°, and again from 315° through 45°. In certain implementations, moreover, the Hall sensors 306A and 306B can be formed substantially below the AMR sensors 182A and 182B in certain examples.

Figure 12:
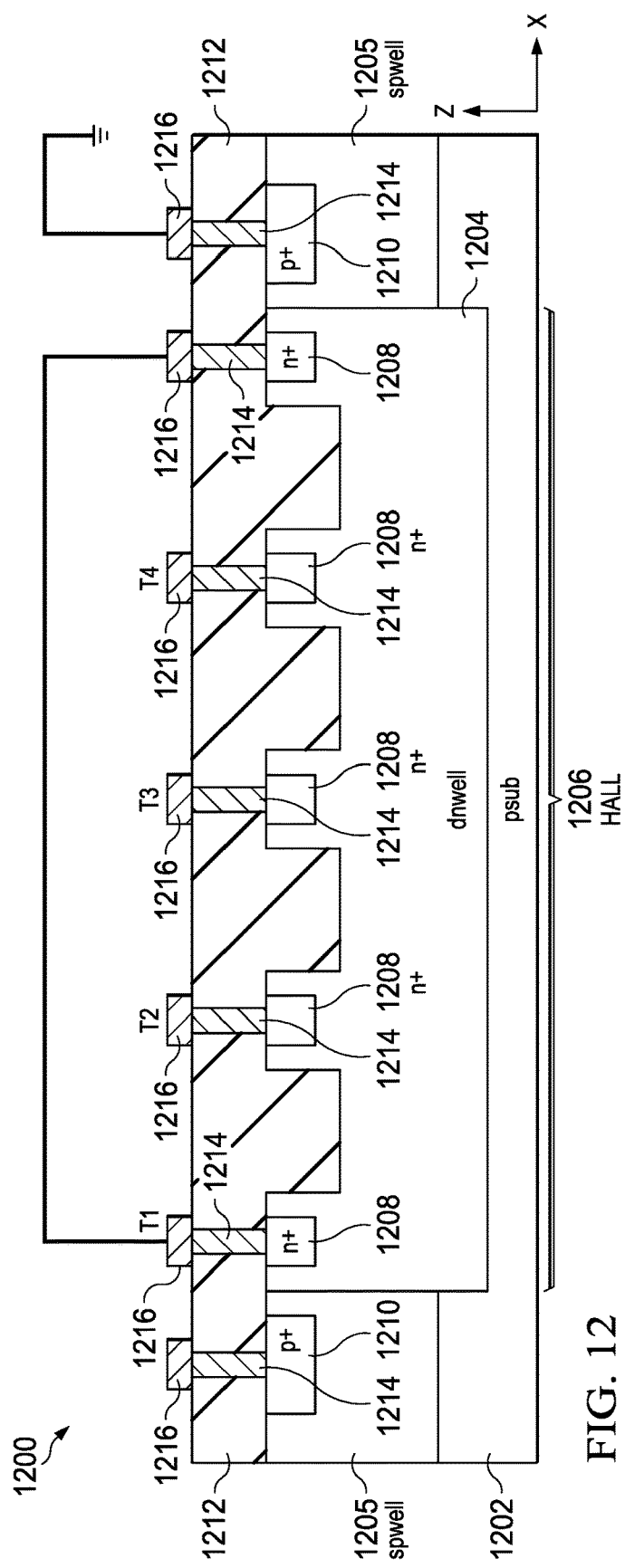

FIGS. 12 and 13 show an example vertical Hall sensor structure 1206 with five contacts. The Hall sensor 1206 in this example is formed on or in an epitaxial silicon substrate 1202 in an IC 1200 with one or more magnetoresistive sensors (not shown in FIGS. 12 and 13, but as illustrated and described above, for example, in FIGS. 1, 2L, 2N, 3B, 3C, 4, 5 and 7). An epitaxial silicon substrate 1202 is implanted using phosphorus or other N-type dopants and a mask (not shown) to form a deep n-well 1204. The n-well doping in this epitaxial example can be less than that used in the above examples, such as about $2 \times 10^{15}$ cm$^{-3}$. A shallow p-well 1205 is formed through implantation of boron or other P-type dopants at least partially surrounding the lateral outer periphery of the well 1204 using a corresponding second implant mask (not shown). N+ regions 1208 are implanted, and P+ regions 1210 are implanted into the upper portions of the substrate 1202 as shown in FIG. 12 using appropriate implantation processes and masks (not shown). A PMD layer 1212 is deposited over the structure. Contacts 1214 are formed through the PMD material 1212 in order to contact the regions 1208 and 1210. FIG. 12 further shows first metallization layer metal structures 1216, including vertical Hall sensor terminals T1-T4. A current source (e.g., current source described above, not shown in FIG. 12) is connected between T1 and T3, and a voltage readout (e.g., sensor 154 described above, not shown in FIG. 12) senses the voltage between T2 and T4 in one non-limiting example. One or more magnetoresistive sensors are then fabricated in further metallization layers (not shown) as described above. In this example, the deep n-well 1204 operates as a Hall plate structure.

Figure 14:
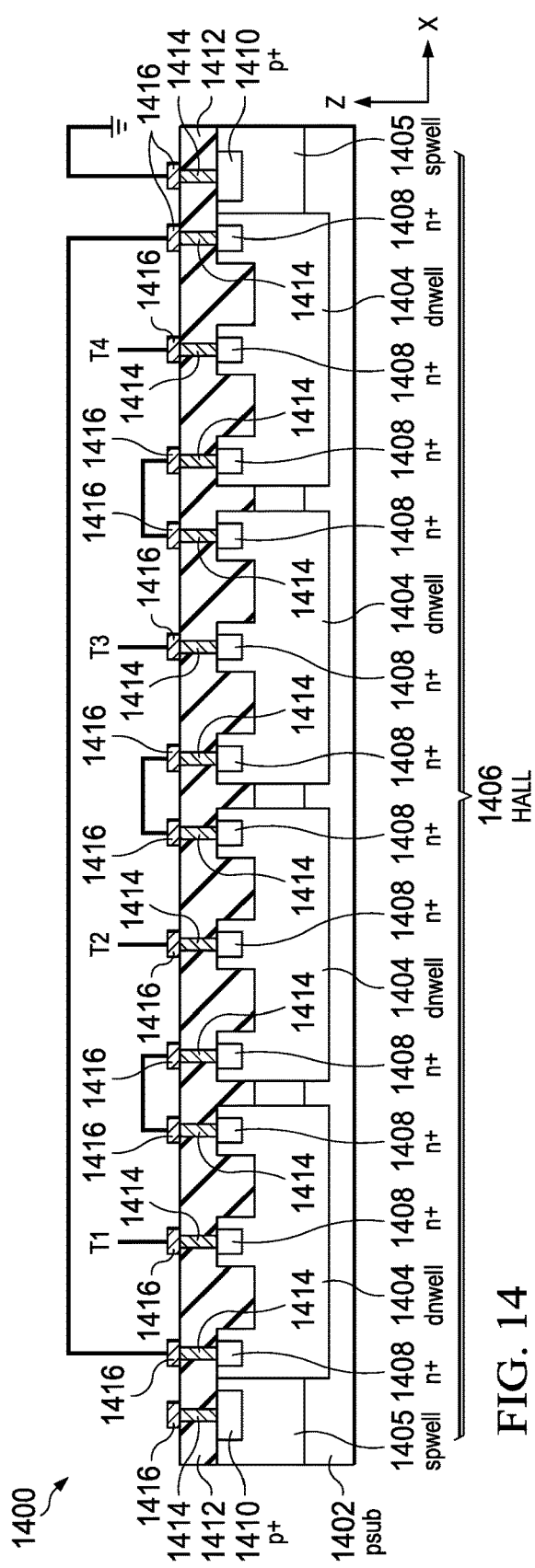
FIGS. 14 and 15 are partial sectional side elevation and top plan views of another example vertical Hall structure formed on or in an epitaxial silicon substrate in an IC with one or more magnetoresistive sensors, including a plurality of symmetrical elements formed in a plurality of deep wells.
Figure 15:
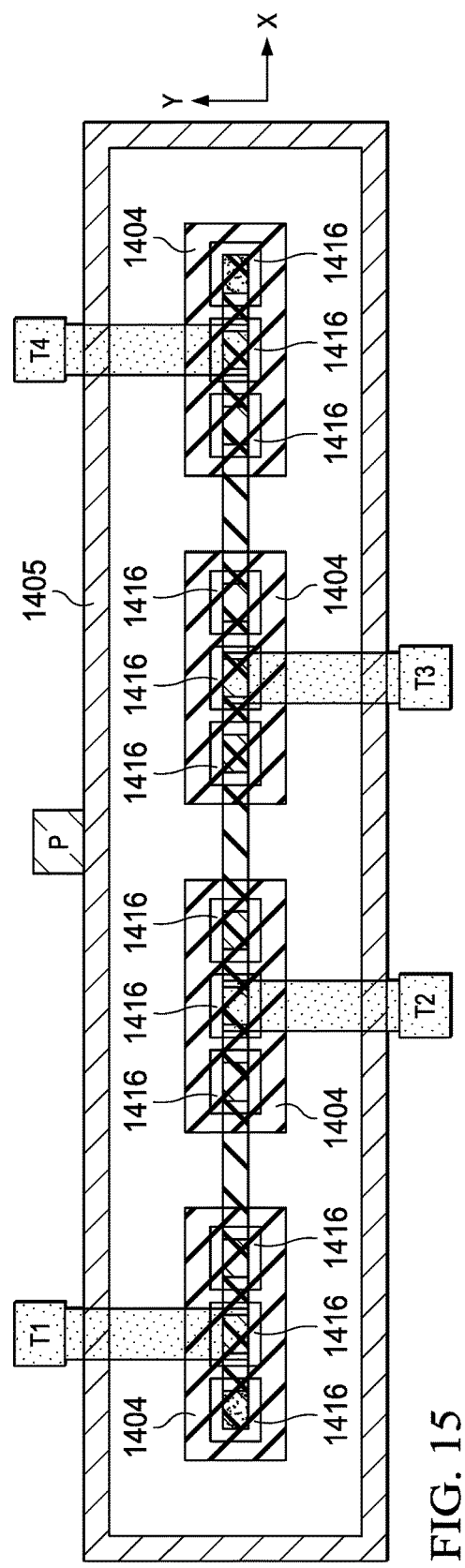

FIGS. 14 and 15 show another example vertical Hall sensor structure 1406 formed on or in an epitaxial silicon substrate 1402 in an IC 1400 with one or more magnetoresistive sensors (not shown in FIGS. 14 and 15, but as illustrated and described above, for example, in FIGS. 1, 2L, 2N, 3B, 3C, 4, 5 and 7). The Hall sensor 1406 in this example includes a plurality of symmetrical elements formed in a plurality of deep wells 1404. The substrate 1402 is implanted using phosphorus or other N-type dopants and a mask (not shown) to form a plurality of deep n-wells 1404 individually operating as Hall plate structures. In the example of FIG. 14, four deep n-wells 1404 are formed. A shallow p-well 1405 is formed by implanting boron or other P-type dopants at least partially surrounding the lateral outer periphery of the n-wells 1404 using a second implant mask (not shown). N+ regions 1408 are implanted, and P+ regions 1410 are implanted into the upper portions of the substrate 1402 using appropriate implantation processes and masks (not shown). A PMD layer 1412 is deposited over the structure. Contacts 1414 are formed through the PMD material 1412 to contact the regions 1408 and 1410. First metallization layer metal structures 1416 are formed, including vertical Hall sensor terminals T1-T4. A current source (not shown in FIG. 14) is connected between T1 and T3, and a voltage readout (not shown) senses the voltage between T2 and T4 in one non-limiting example, e.g., as described above. One or more magnetoresistive sensors are then fabricated in further metallization layers are described above.

Figure 16:
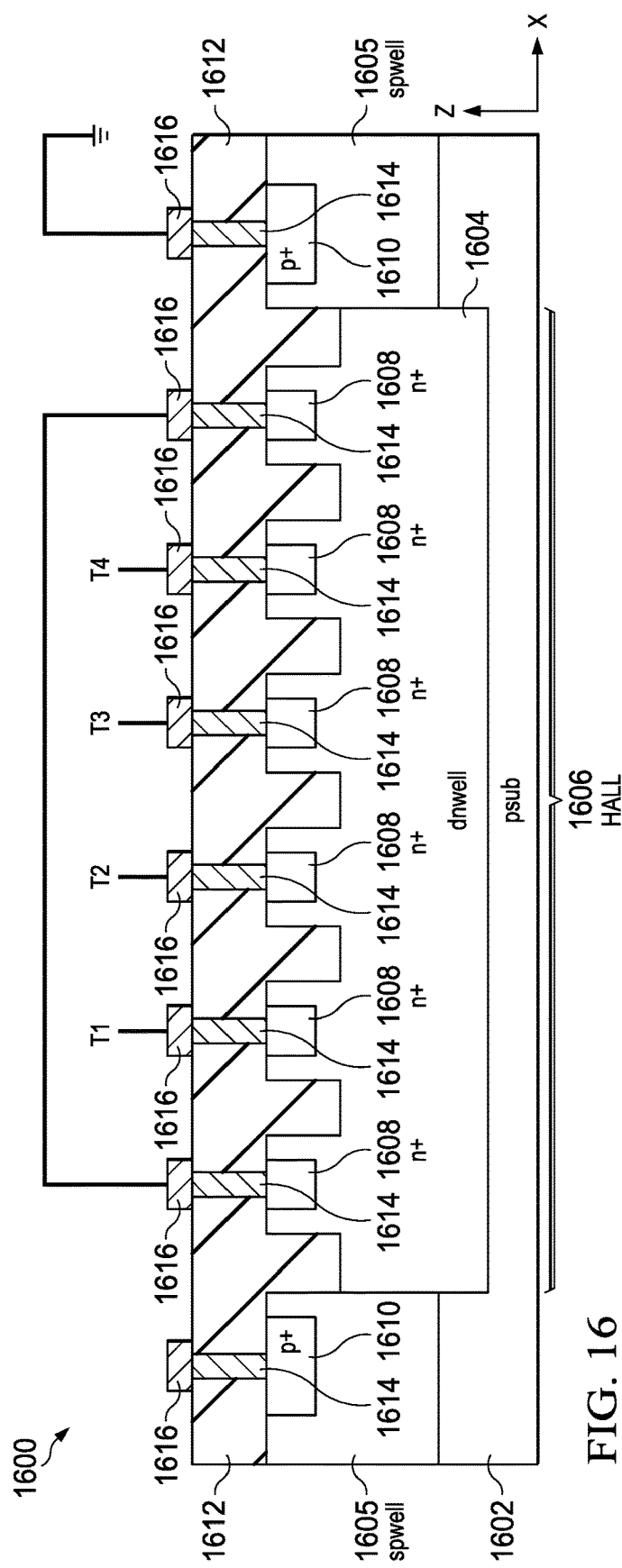
FIGS. 16 and 17 are partial sectional side elevation and top plan views of another example vertical Hall structure formed on or in an epitaxial silicon substrate in an IC with one or more magnetoresistive sensors, including six contacts and four terminals.
Figure 17:
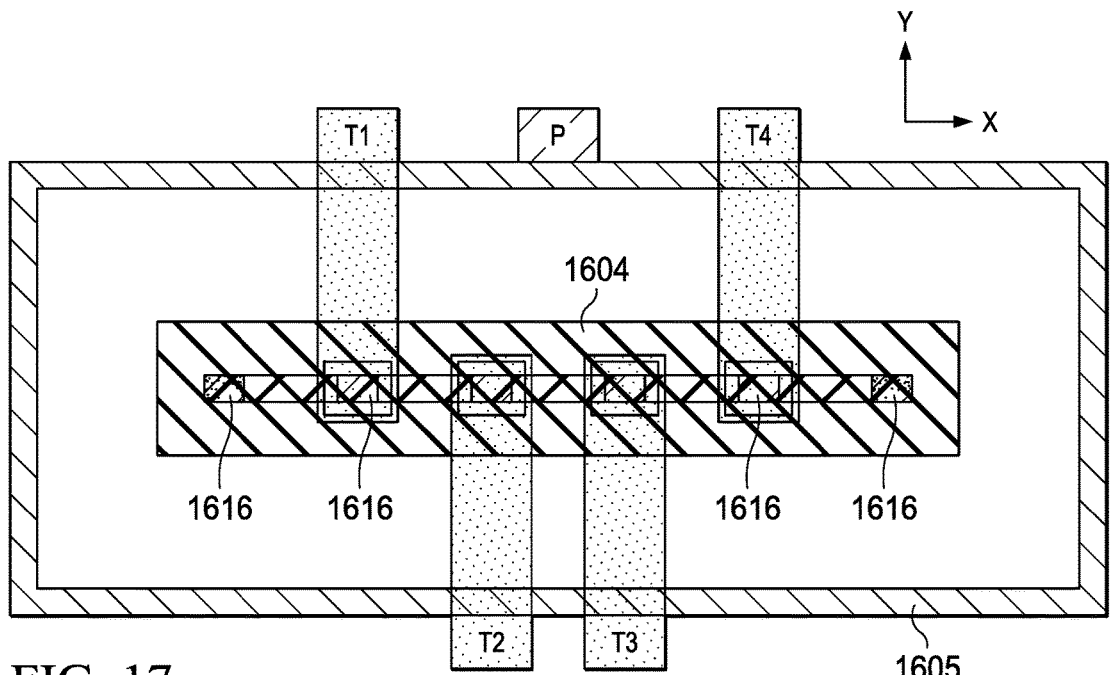

Turning now to FIGS. 16 and 17, another example vertical Hall structure 1606 is formed on or in an epitaxial silicon substrate 1602 in an IC 1600 with one or more magnetoresistive sensors (not shown, but as illustrated and described above, for example, in FIGS. 1, 2L, 2N, 3B, 3C, 4, 5 and 7). The Hall sensor 1606 in this example includes six contacts and four terminals T1-T4. The substrate 1602 is implanted using phosphorus or other N-type dopants and a mask (not shown) to form the deep n-well 1604 to operate as a Hall plate of the sensor 1606. A shallow p-well 1405 is formed by implanting boron or other P-type dopants at least partially surrounding the lateral outer periphery of the n-well 1604 using a second implant mask (not shown). N+ regions 1608 are implanted for the terminals T1-T4, and P+ regions 1610 are implanted using appropriate implantation processes and masks (not shown). A PMD layer 1612 is formed over the structure, and contacts 1614 are formed through the PMD layer 1612 to contact the regions 1608 and 1610. First metallization layer metal structures 1416 include vertical Hall sensor terminals T1-T4 for connection to a current source (not shown, e.g., T1 and T3) and a voltage readout (not shown, T2 and T4), e.g., as described above. One or more magnetoresistive sensors are then fabricated in further metallization layers (not shown) as described above.

Other example vertical Hall structures can be used, such as circular or L-shaped Hall sensors formed on and/or in a substrate.

Figure 19:
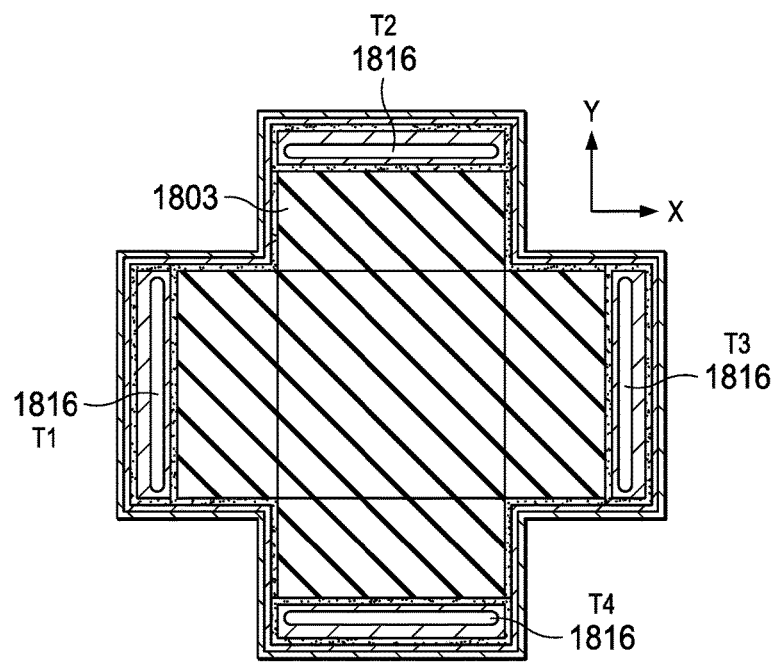
FIGS. 18 and 19 are partial sectional side elevation and top plan views of another example horizontal Hall structure formed on or in an epitaxial silicon substrate in an IC with one or more magnetoresistive sensors, including a Hall plate formed in a deep well.
Figure 18:
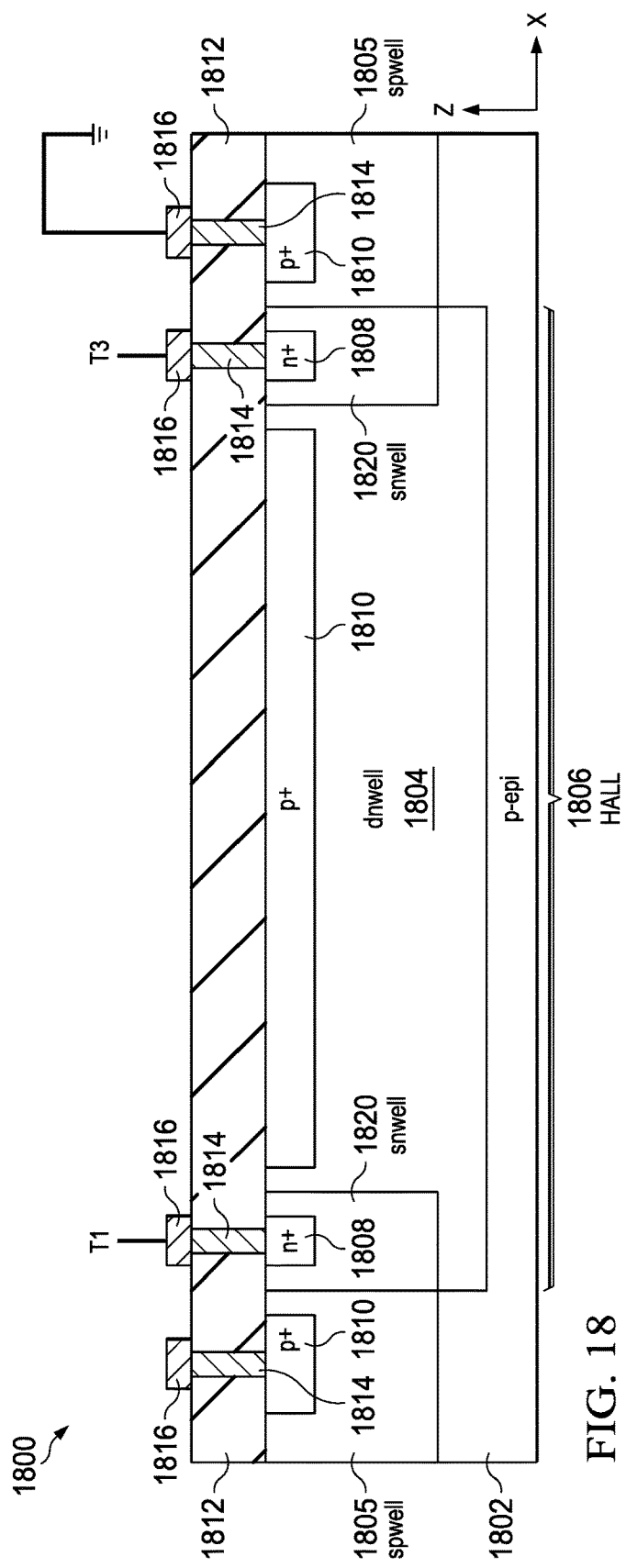

FIGS. 18 and 19 illustrate another example horizontal Hall structure 1806 formed on or in an epitaxial silicon substrate 1802 in an IC 1800 with one or more magnetoresistive sensors. This example includes a Hall plate formed in a deep n-well 1804. One or more magnetoresistive sensors (not shown, for example, as shown in FIGS. 1, 2L, 2N, 3B, 3C, 4, 5 and 7). The horizontal Hall sensor 1806 includes a deep n-well 1804 providing a Hall plate formed by implanting the substrate 1802 using phosphorus or other N-type dopants using an implant mask (not shown). A shallow p-well 1805 is formed by implanting boron or other P-type dopants at least partially surrounding the lateral outer periphery of the n-well 1804 using a second implant mask (not shown), and a shallow n-well 1820 is formed under terminals T1 and T3 for conducting current from a current source (not shown). N+ regions 1808 are implanted within the shallow n-well 1820, and P+ regions 1810 are implanted into the upper portions of the substrate 1802 using suitable implantation processes and masks (not shown). A PMD layer 1812 is deposited over the structure, and contacts 1814 are formed through the PMD material 1812 to contact the regions 1808 and 1810. First metallization layer metal structures 1816 are formed, including Hall sensor terminals T1-T4 (T2 and T4 shown in FIG. 19 for connection to a voltage readout, not shown). One or more magnetoresistive sensors are then fabricated in further metallization layers are described above.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The invention claimed is:

1. An integrated circuit (IC), comprising:
   a substrate having a top surface,
   a Hall effect sensor circuit formed at least partially on or in the substrate, wherein the Hall effect sensor circuit comprises a Hall sensor for sensing magnetic fields oriented parallel or horizontal to the top surface of the substrate; and
   a magnetoresistive sensor circuit formed in a metallization structure located over the substrate,
   the Hall effect sensor and the magnetoresistive sensor circuit being configured to cooperate to detect 360° rotation of the substrate.

2. The IC of claim 1, wherein the magnetoresistive sensor circuit comprises:
   a first magnetoresistive sensor including a first set of magnetoresistive sections extending in a first section direction in the metallization structure parallel to the top surface; and
   a second magnetoresistive sensor including a second set of magnetoresistive sections extending in a second different section direction in the metallization structure parallel to the top surface;
   wherein the first section directions are offset 45 degrees from the second section directions.

3. The IC of claim 2, wherein the first and second section directions differ by about 45°.

4. The IC of claim 2, wherein the first magnetoresistive sensor includes a third set of magnetoresistive sections extending in a third different section direction in the metallization structure parallel to the top surface, and the second magnetoresistive sensor includes a fourth set of magnetoresistive sections extending in a fourth different section direction in the metallization structure parallel to the top surface.

5. The IC of claim 1, wherein the magnetoresistive sensor circuit comprises at least one magnetoresistive sensor, including four magnetoresistive sections connected in a bridge circuit, the individual magnetoresistive sections extending parallel to the top surface of the substrate in the metallization structure from a first section end to a second section end, the individual magnetoresistive sections comprising:
  a base layer comprising tantalum nitride, the base layer electrically coupled with a first conductive structure proximate the first section end, the base layer electrically coupled with a second conductive structure proximate the second section end;
  a nickel iron alloy layer extending over at least a portion of the base layer; and
  an aluminum nitride layer extending over at least a portion of the nickel iron alloy layer.

6. The IC of claim 5, wherein the individual magnetoresistive sections comprise:
  a first tungsten via structure extending from a bottom side of the base layer proximate the first section end to a first conductive structure; and
  a second tungsten via structure extending from the bottom side of the base layer proximate the second section end to a second conductive structure.

7. The IC of claim 1, further comprising:
  a current source circuit formed at least partially on or in the substrate to provide a current signal to the Hall effect sensor circuit; and
  a plurality of voltage readout circuits formed at least partially on or in the substrate to sense a corresponding voltage signal from one of the Hall effect sensor circuit and the magnetoresistive sensor circuit.

8. The IC of claim 1, wherein the Hall effect sensor circuit is located at least partially between the magnetoresistive sensor circuit and the substrate top surface.

9. An integrated circuit (IC), comprising:
  a substrate having a top surface,
  a Hall effect sensor circuit formed at least partially on or in the substrate, wherein the Hall effect sensor circuit comprises:
    a vertical Hall sensor for sensing magnetic fields oriented parallel to the top surface of the substrate, the vertical Hall sensor including a Hall plate disposed in the substrate; and
    a horizontal Hall sensor for sensing magnetic fields oriented perpendicular to the top surface of the substrate, the horizontal Hall sensor including a Hall plate disposed in the substrate;
  a metallization structure disposed over the top surface of the substrate; and
  a magnetoresistive sensor circuit formed in the metallization structure for sensing magnetic fields oriented parallel to the top surface of the substrate.

10. The IC of claim 9, wherein the magnetoresistive sensor circuit comprises:
  a first magnetoresistive sensor including a first set of magnetoresistive sections extending in first section directions in the metallization structure parallel to the top surface of the substrate, the first set of magnetoresistive sections connected in a first bridge circuit; and
  a second magnetoresistive sensor including a second set of magnetoresistive sections extending in second section directions in the metallization structure parallel to the top surface of the substrate, the second set of magnetoresistive sections connected in a second bridge circuit;
  wherein the first section directions are offset 45 degrees from the second section directions.

11. The IC of claim 9, wherein the magnetoresistive sensor circuit is formed in a top metallization layer of the metallization structure.

12. The IC of claim 9, wherein the magnetoresistive sensor circuit comprises at least one magnetoresistive sensor, including four magnetoresistive sections connected in a bridge circuit, the individual magnetoresistive sections extending parallel to the top surface of the substrate in the metallization structure from a first section end to a second section end, the individual magnetoresistive sections comprising:
  a base layer comprising tantalum nitride, the base layer electrically coupled with a first conductive structure proximate the first section end, the base layer electrically coupled with a second conductive structure proximate the second section end;
  a nickel iron alloy layer extending over at least a portion of the base layer; and
  an aluminum nitride layer extending over at least a portion of the nickel iron alloy layer.

13. The IC of claim 12, wherein the individual magnetoresistive sections comprise:
  a first tungsten via structure extending from a bottom side of the base layer proximate the first section end to a first conductive structure; and
  a second tungsten via structure extending from the bottom side of the base layer proximate the second section end to a second conductive structure.

14. The IC of claim 9, further comprising:
  a current source circuit formed at least partially on or in the substrate to provide a current signal to the Hall effect sensor circuit; and
  a plurality of voltage readout circuits formed at least partially on or in the substrate to sense a corresponding voltage signal from one of the Hall effect sensor circuit and the magnetoresistive sensor circuit.

15. The IC of claim 9, wherein the magnetoresistive sensor circuit is disposed in the metallization structure at least partially above the Hall effect sensor circuit.

* * * * *